(12) United States Patent
Lee et al.

(10) Patent No.: US 12,394,753 B2
(45) Date of Patent: Aug. 19, 2025

(54) SEMICONDUCTOR PACKAGE

(71) Applicant: Samsung Electronics Co., Ltd., Suwon-si (KR)

(72) Inventors: Hyeonseok Lee, Pyeongtaek-si (KR); Jongyoun Kim, Seoul (KR); Seokhyun Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/763,686

(22) Filed: Jul. 3, 2024

(65) Prior Publication Data

US 2024/0355779 A1 Oct. 24, 2024

Related U.S. Application Data

(63) Continuation of application No. 17/723,981, filed on Apr. 19, 2022, now Pat. No. 12,057,435.

(30) Foreign Application Priority Data

Aug. 31, 2021 (KR) .......................... 10-2021-0115589

(51) Int. Cl.
*H01L 25/065* (2023.01)
*H01L 23/00* (2006.01)
(Continued)

(52) U.S. Cl.
CPC .... *H01L 25/0655* (2013.01); *H01L 23/49816* (2013.01); *H01L 23/49822* (2013.01);
(Continued)

(58) Field of Classification Search
CPC .......... H01L 25/0655; H01L 23/49816; H01L 23/49822
See application file for complete search history.

(56) References Cited

U.S. PATENT DOCUMENTS 8,592,259 B2 11/2013 Hu et al.
8,957,694 B2 2/2015 Hu et al.
(Continued)

FOREIGN PATENT DOCUMENTS

| EP | 3993027 A2 * | 5/2022 | .......... H01L 21/563 |
|---|---|---|---|
| EP | 4002450 A1 * | 5/2022 | .......... H01L 23/485 |
| KR | 20230018090 A | 2/2023 | |

*Primary Examiner* — Laura M Menz
(74) *Attorney, Agent, or Firm* — Harness, Dickey & Pierce, P.L.C.

(57) ABSTRACT

A semiconductor package includes a redistribution substrate having first and second surfaces, a first semiconductor chip on the first surface, external terminals on the second surface, a second semiconductor chip above the first semiconductor chip, external connection members below the second semiconductor chip, conductive pillars electrically connecting the external connection members to the redistribution substrate. The second semiconductor chip includes a device layer, a wiring layer, and a redistribution layer on a semiconductor substrate. The wiring layer includes intermetallic dielectric layers, wiring lines, and a conductive pad connected to an uppermost wiring line. The redistribution layer includes a first redistribution dielectric layer, a first redistribution pattern, and a second redistribution dielectric layer. A vertical distance between the semiconductor substrate and the conductive pillars is less than that between the first semiconductor chip and the external terminals.

20 Claims, 17 Drawing Sheets

(51) Int. Cl.
*H01L 23/498* (2006.01)
*H01L 23/522* (2006.01)
*H01L 23/528* (2006.01)

(52) U.S. Cl.
CPC .... *H01L 23/49838* (2013.01); *H01L 23/5226* (2013.01); *H01L 23/5283* (2013.01); *H01L 24/13* (2013.01); *H01L 24/16* (2013.01); *H01L 24/17* (2013.01); H01L 2224/13008 (2013.01); H01L 2224/13017 (2013.01); H01L 2224/13019 (2013.01); H01L 2224/13022 (2013.01); H01L 2224/13024 (2013.01); H01L 2224/13082 (2013.01); H01L 2224/13147 (2013.01); H01L 2224/13166 (2013.01); H01L 2224/13184 (2013.01); H01L 2224/13541 (2013.01); H01L 2224/13553 (2013.01); H01L 2224/1357 (2013.01); H01L 2224/16014 (2013.01); H01L 2224/16055 (2013.01); H01L 2224/16058 (2013.01); H01L 2224/16235 (2013.01); H01L 2224/1703 (2013.01); H01L 2224/17055 (2013.01); H01L 2924/182 (2013.01)

(56) References Cited

U.S. PATENT DOCUMENTS

| | | | |
|---|---|---|---|
| 9,396,300 B2 * | 7/2016 | Wang | H01L 24/96 |
| 9,966,325 B2 * | 5/2018 | Beyne | H01L 25/50 |
| 10,090,266 B2 | 10/2018 | Choi et al. | |
| 10,354,976 B2 | 7/2019 | Tao et al. | |
| 10,930,625 B2 * | 2/2021 | Suk | H01L 21/565 |
| 11,348,876 B2 * | 5/2022 | Suk | H01L 21/565 |
| 11,587,897 B2 * | 2/2023 | Shin | H01L 23/291 |
| 11,610,785 B2 * | 3/2023 | Lee | H01L 24/06 |
| 11,626,393 B2 * | 4/2023 | Suk | H01L 21/4857 |
| | | | 438/106 |
| 11,646,260 B2 * | 5/2023 | Kim | H01L 21/6835 |
| | | | 257/737 |
| 11,676,887 B2 * | 6/2023 | Jin | H01L 23/49816 |
| | | | 257/668 |
| 11,742,271 B2 * | 8/2023 | Kang | H01L 23/49822 |
| | | | 257/738 |
| 11,810,915 B2 * | 11/2023 | Suk | H10D 1/692 |
| 11,862,596 B2 * | 1/2024 | Kim | H01L 25/105 |
| 11,869,775 B2 * | 1/2024 | Lee | H01L 25/105 |
| 11,929,316 B2 * | 3/2024 | Kim | H01L 23/49838 |
| 11,996,358 B2 * | 5/2024 | Choi | H01L 23/49822 |
| 12,033,961 B2 * | 7/2024 | Kim | H01L 23/49822 |
| 12,057,435 B2 * | 8/2024 | Lee | H01L 23/3135 |
| 12,170,251 B2 * | 12/2024 | Suk | H01L 21/563 |
| 2015/0364454 A1 | 12/2015 | Zhai et al. | |
| 2018/0006006 A1 * | 1/2018 | Kim | H01L 25/50 |
| 2020/0083201 A1 * | 3/2020 | Suk | H01L 24/08 |
| 2020/0373216 A1 * | 11/2020 | Yoo | H01L 24/05 |
| 2021/0066560 A1 * | 3/2021 | Kim | H10H 20/8506 |
| 2021/0082824 A1 * | 3/2021 | Yu | H01L 25/50 |
| 2021/0111128 A1 * | 4/2021 | Suk | H01L 23/3114 |
| 2021/0193636 A1 * | 6/2021 | Suk | H01L 24/19 |
| 2021/0305188 A1 * | 9/2021 | Shin | H01L 25/0652 |
| 2021/0375810 A1 * | 12/2021 | Kim | H01L 23/585 |
| 2022/0037248 A1 * | 2/2022 | Choi | H01L 21/4857 |
| 2022/0045010 A1 * | 2/2022 | Shin | H01L 24/48 |
| 2022/0059442 A1 * | 2/2022 | Oh | H01L 21/6835 |
| 2022/0059444 A1 * | 2/2022 | Kim | H01L 23/49822 |
| 2022/0077041 A1 * | 3/2022 | Jeon | H01L 21/4857 |
| 2022/0077066 A1 * | 3/2022 | Kim | H01L 24/19 |
| 2022/0084924 A1 * | 3/2022 | Kim | H01L 25/18 |
| 2022/0084993 A1 * | 3/2022 | Kim | H01L 24/20 |
| 2022/0102282 A1 * | 3/2022 | Suk | H01L 24/19 |
| 2022/0115350 A1 * | 4/2022 | Mun | H01L 21/561 |
| 2022/0130685 A1 * | 4/2022 | Lee | H01L 21/563 |
| 2022/0157810 A1 * | 5/2022 | Suk | H01L 23/5386 |
| 2022/0310496 A1 * | 9/2022 | Kim | H01L 23/49822 |
| 2022/0320053 A1 * | 10/2022 | Lee | H01L 23/5389 |
| 2022/0352124 A1 * | 11/2022 | Kim | H01L 21/6835 |
| 2022/0399286 A1 * | 12/2022 | Kim | H01L 24/20 |
| 2022/0415771 A1 * | 12/2022 | Hwang | H01L 23/49816 |
| 2022/0415802 A1 * | 12/2022 | Kim | H01L 24/48 |
| 2022/0415838 A1 * | 12/2022 | Lee | H01L 24/20 |
| 2023/0005842 A1 * | 1/2023 | Kim | H01L 25/18 |
| 2023/0035026 A1 * | 2/2023 | Kim | H01L 24/17 |
| 2023/0038603 A1 * | 2/2023 | Choi | H01L 22/32 |
| 2023/0047345 A1 * | 2/2023 | Hwang | H01L 25/0657 |
| 2023/0049283 A1 * | 2/2023 | Suk | H01L 24/19 |
| 2023/0056041 A1 * | 2/2023 | Kim | H01L 24/16 |
| 2023/0065378 A1 * | 3/2023 | Kim | H01L 24/17 |
| 2023/0069490 A1 * | 3/2023 | Lee | H01L 23/49838 |
| 2023/0101149 A1 * | 3/2023 | Yoo | H01L 23/5389 |
| | | | 257/773 |
| 2023/0107492 A1 * | 4/2023 | Song | H01L 23/544 |
| | | | 257/797 |
| 2023/0197469 A1 * | 6/2023 | Lee | H01L 21/563 |
| | | | 257/737 |
| 2023/0207441 A1 * | 6/2023 | Kim | H01L 24/17 |
| | | | 257/737 |
| 2023/0245966 A1 * | 8/2023 | Suk | H01L 24/08 |
| | | | 257/737 |
| 2023/0352411 A1 * | 11/2023 | Choi | H01L 25/50 |
| 2024/0021608 A1 * | 1/2024 | Suk | H10D 84/212 |
| 2024/0055339 A1 * | 2/2024 | Park | H01L 25/0657 |
| 2024/0055394 A1 * | 2/2024 | Lee | H01L 23/3135 |
| 2024/0063103 A1 * | 2/2024 | Kim | H01L 25/105 |
| 2024/0063129 A1 * | 2/2024 | Ahn | H01L 25/0655 |
| 2024/0071866 A1 * | 2/2024 | Kim | H01L 23/49816 |
| 2024/0312894 A1 * | 9/2024 | Choi | H01L 25/105 |
| 2024/0355779 A1 * | 10/2024 | Lee | H01L 23/3135 |

* cited by examiner

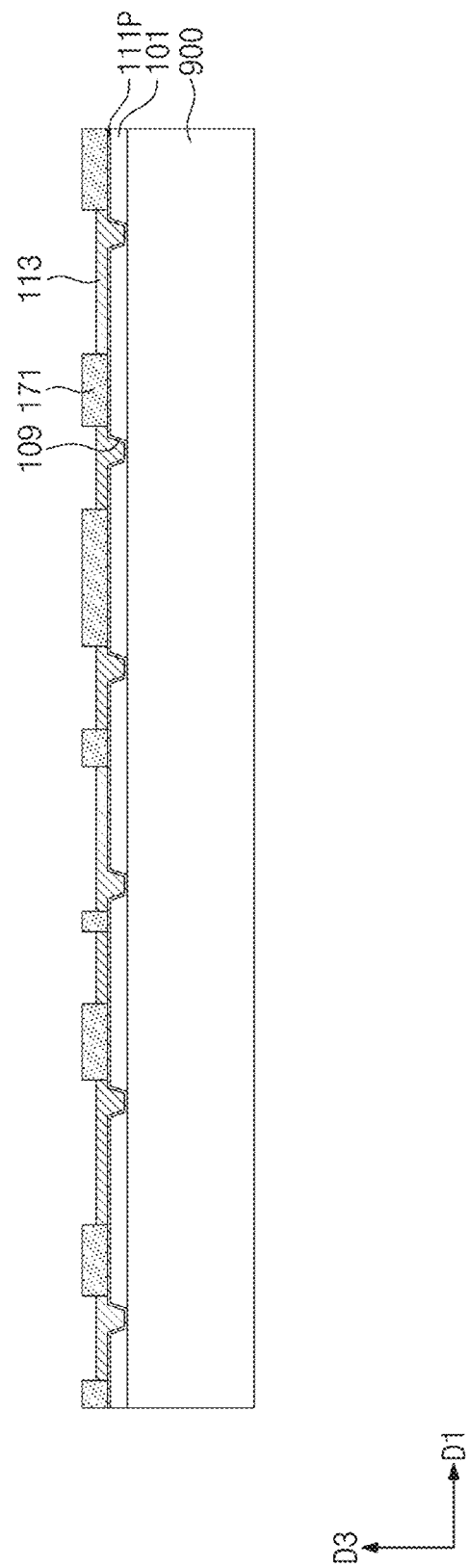

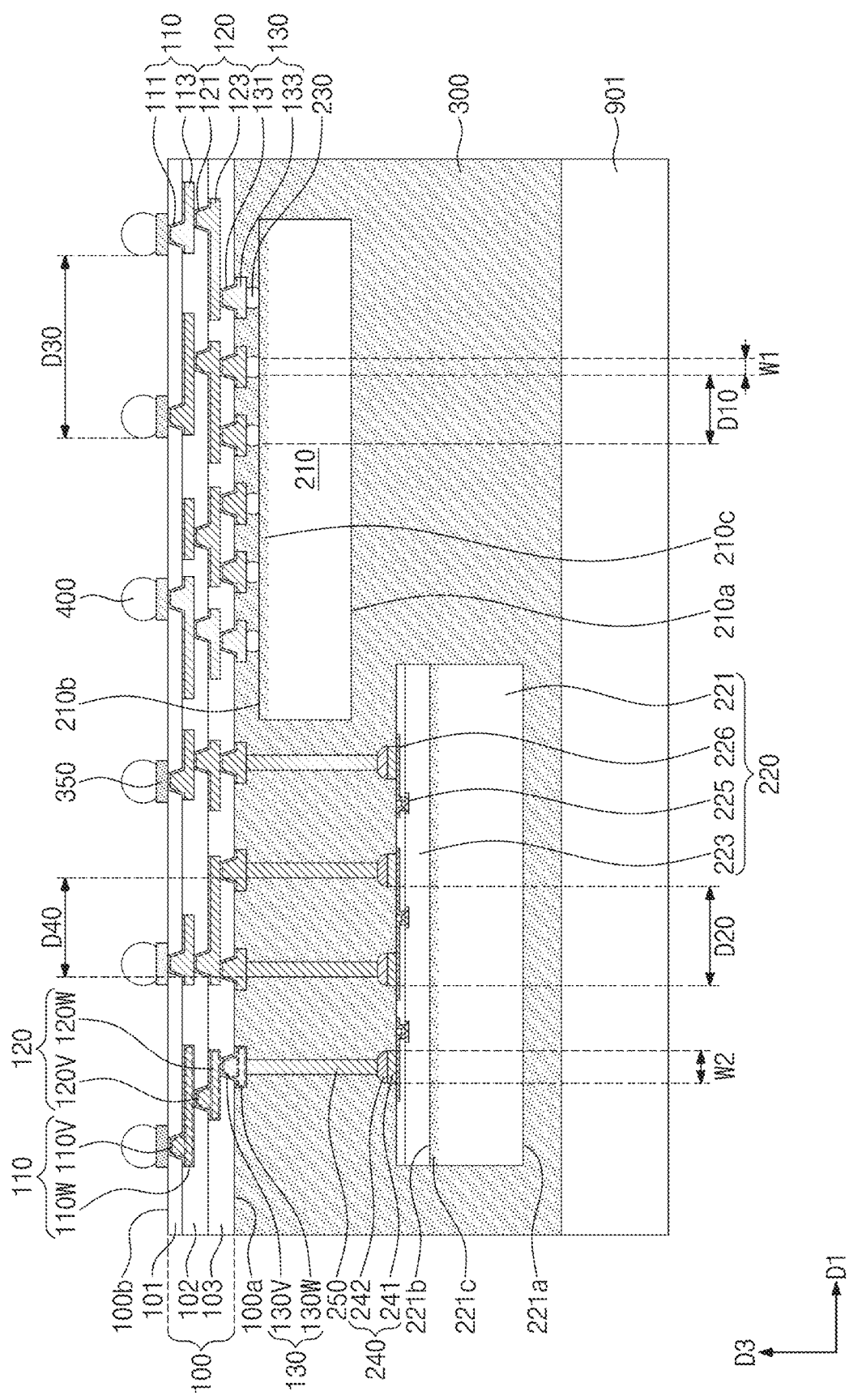

SEMICONDUCTOR PACKAGE

CROSS-REFERENCE TO RELATED APPLICATION

This U.S. nonprovisional application is a continuation of U.S. patent application Ser. No. 17/723,981 filed on Apr. 19, 2022, now U.S. Pat. No. 12,057,435 issued on Aug. 6, 2024, which claims priority under 35 U.S.C § 119 to Korean Patent Application No. 10-2021-0115589 filed on Aug. 31, 2021 in the Korean Intellectual Property Office, the disclosure of each of which is hereby incorporated by reference in its entirety.

BACKGROUND

The present inventive concepts relate to a semiconductor package, and more particularly, to a semiconductor package including stacked semiconductor chips.

In the semiconductor industry, high capacity, thinness, and small size of semiconductor devices and electronic products using the same have been demanded and thus various package techniques have been suggested. A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of the electronics industry, electronic products have increasing demands for high performance, high speed, and compact size.

SUMMARY

Some embodiments of the present inventive concepts provide a semiconductor package whose electrical properties are improved.

According to some embodiments of the present inventive concepts, a semiconductor package may comprise: a redistribution substrate having a first surface and a second surface that are opposite to each other; a first semiconductor chip on the first surface of the redistribution substrate; a plurality of external terminals on the second surface of the redistribution substrate; a second semiconductor chip above the first semiconductor chip; a plurality of external connection members below the second semiconductor chip, each of the external connection members including a conductive bump pattern and a solder pattern on the conductive bump pattern; and a plurality of conductive pillars that electrically connect the external connection members to the redistribution substrate. The second semiconductor chip may include: a semiconductor substrate; and a device layer, a wiring layer, and a redistribution layer sequentially stacked on the semiconductor substrate. The wiring layer may include: a plurality of sequentially stacked intermetallic dielectric layers; a plurality of wiring lines between the intermetallic dielectric layers; and a conductive pad connected to an uppermost one of the wiring lines. The redistribution layer may include: a first redistribution dielectric layer that covers the wiring layer; a first redistribution pattern that penetrates the first redistribution dielectric layer to connect with the conductive pad and extends onto the first redistribution dielectric layer; and a second redistribution dielectric layer that covers the first redistribution pattern and the first redistribution dielectric layer. A vertical distance between the semiconductor substrate and the conductive pillars may be less than a vertical distance between the first semiconductor chip and the external terminals.

According to some embodiments of the present inventive concepts, a semiconductor package may comprise: a redistribution substrate having a first surface and a second surface that are opposite to each other; a first semiconductor chip on the first surface of the redistribution substrate; a second semiconductor chip above the first semiconductor chip, a portion of the second semiconductor chip vertically overlapping the first semiconductor chip; a plurality of connection terminals between the first semiconductor chip and the redistribution substrate; a plurality of external connection members below the second semiconductor chip; and a plurality of conductive pillars that vertically extends from the redistribution substrate toward the external connection members. The second semiconductor chip may include: a semiconductor substrate; and a device layer, a wiring layer, and a redistribution layer sequentially stacked on the semiconductor substrate. The wiring layer may include: a plurality of sequentially stacked intermetallic dielectric layers; a plurality of wiring lines between the intermetallic dielectric layers; and a conductive pad connected to an uppermost one of the wiring lines. The redistribution layer may include: a first redistribution dielectric layer that covers the wiring layer; a first redistribution pattern that penetrates the first redistribution dielectric layer to connect with the conductive pad and extends onto the first redistribution dielectric layer; and a second redistribution dielectric layer that covers the first redistribution pattern and the first redistribution dielectric layer. Each of the external connection members may include: a conductive bump pattern in contact with the first redistribution pattern; and a solder pattern on the conductive bump pattern. A pitch between the connection terminals may be less than a pitch between the external connection members. A maximum width of each of the connection terminals may be less than a maximum width of each of the external connection members.

According to some embodiments of the present inventive concepts, a semiconductor package may comprise: a redistribution substrate having a first surface and a second surface opposite to each other, the redistribution substrate including: a first redistribution dielectric layer; and a first redistribution pattern, a second redistribution pattern, and a third redistribution pattern sequentially provided in a direction from the second surface toward the first surface of the redistribution substrate; a first semiconductor chip on the first surface of the redistribution substrate; a second semiconductor chip above the first semiconductor chip, a portion of the second semiconductor chip vertically overlaps the first semiconductor chip; a plurality of connection terminals between the first semiconductor chip and the redistribution substrate; a plurality of external connection members on the second semiconductor chip, each of the external connection members including a conductive bump pattern and a solder pattern on the conductive bump pattern; a plurality of conductive pillars that electrically connect the solder pattern to the redistribution substrate; a molding layer that covers the first semiconductor chip and the second semiconductor chip; and a plurality of external terminals on the second surface of the redistribution substrate. The second semiconductor chip may include: a semiconductor substrate; and a device layer, a wiring layer, and a redistribution layer sequentially stacked on the semiconductor substrate. The wiring layer may include: a plurality of sequentially stacked intermetallic dielectric layers; a plurality of wiring lines between the intermetallic dielectric layers; and a conductive pad connected to an uppermost one of the wiring lines. The redistribution layer may include: a second redistribution dielectric layer that covers the wiring layer; a fourth redistribution pattern that penetrates the second redistribution dielectric layer to connect with the conductive pad and extends onto the second redistribution dielectric layer; and a third redistribution dielectric layer that covers the fourth redistribution pattern and the second redistribution dielectric layer. The fourth redistribution pattern may include: a contact part that penetrates the second redistribution dielectric layer to connect with the conductive pad; a pad part on the second redistribution dielectric layer; and a line part that connects the contact part to the pad part. The pad part may be in contact with the conductive bump pattern. Each of the first, second, and third redistribution patterns may include: a wire part that extends in a direction parallel to the first surface of the redistribution substrate; and a via part that protrudes from the wire part in a direction toward the second surface of the redistribution substrate. A width of the via part may decrease in a direction from the first surface toward the second surface of the redistribution substrate. A vertical distance between the semiconductor substrate and the conductive pillars may be less than a vertical distance between the first semiconductor chip and the external terminals.

BRIEF DESCRIPTION OF THE DRAWINGS

The drawings described herein are for illustrative purposes only of selected embodiments and not all possible implementations, and are not intended to limit the scope of the present disclosure.

FIGS. 5A to 5L illustrate cross-sectional views showing a method of fabricating a semiconductor package according to some embodiments of the present inventive concepts.

DETAILED DESCRIPTION OF EMBODIMENTS

Figure 1:
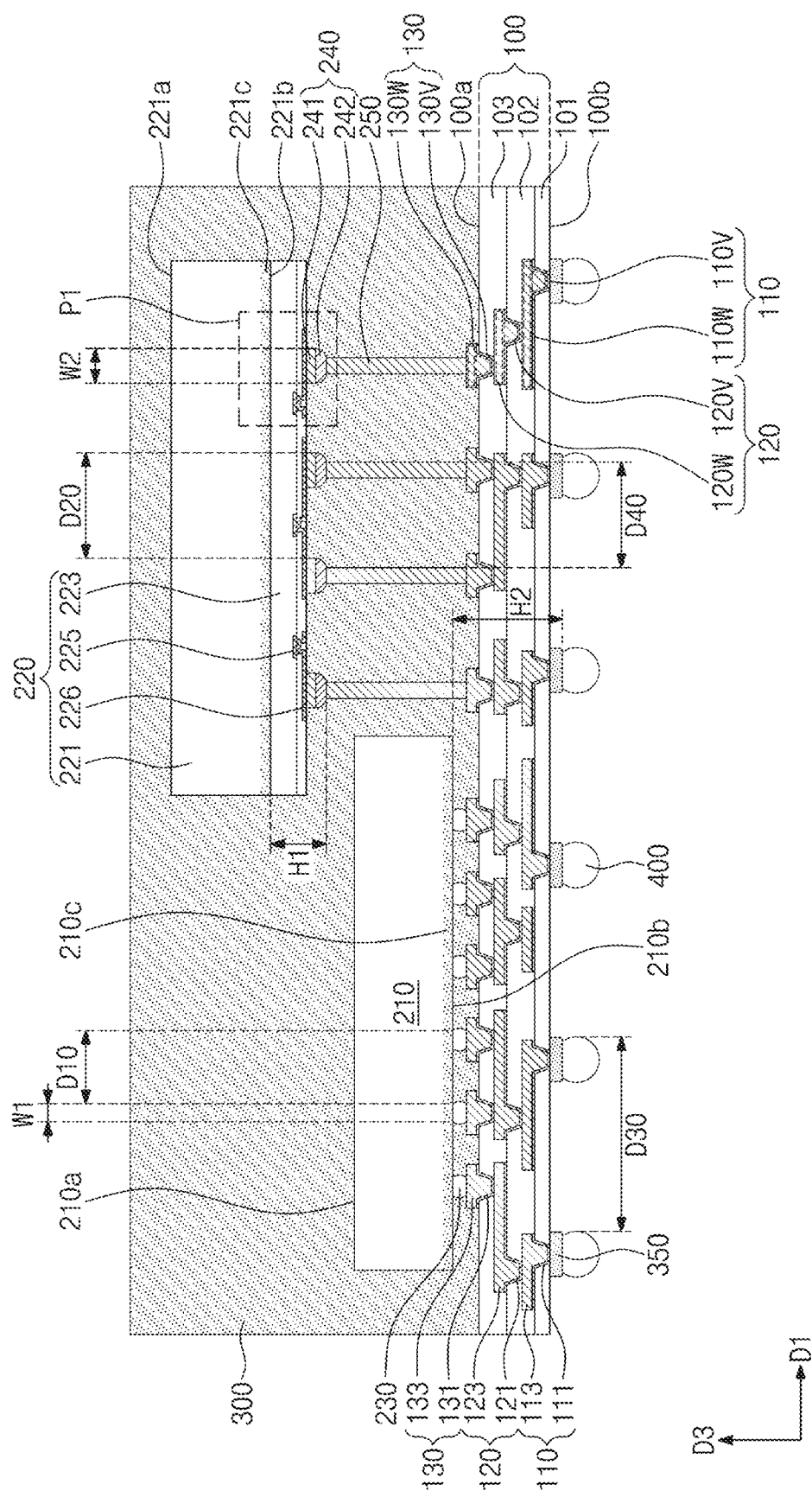
FIG. 1 illustrates a cross-sectional view showing a semiconductor package according to some embodiments of the present inventive concepts.
Figure 2:
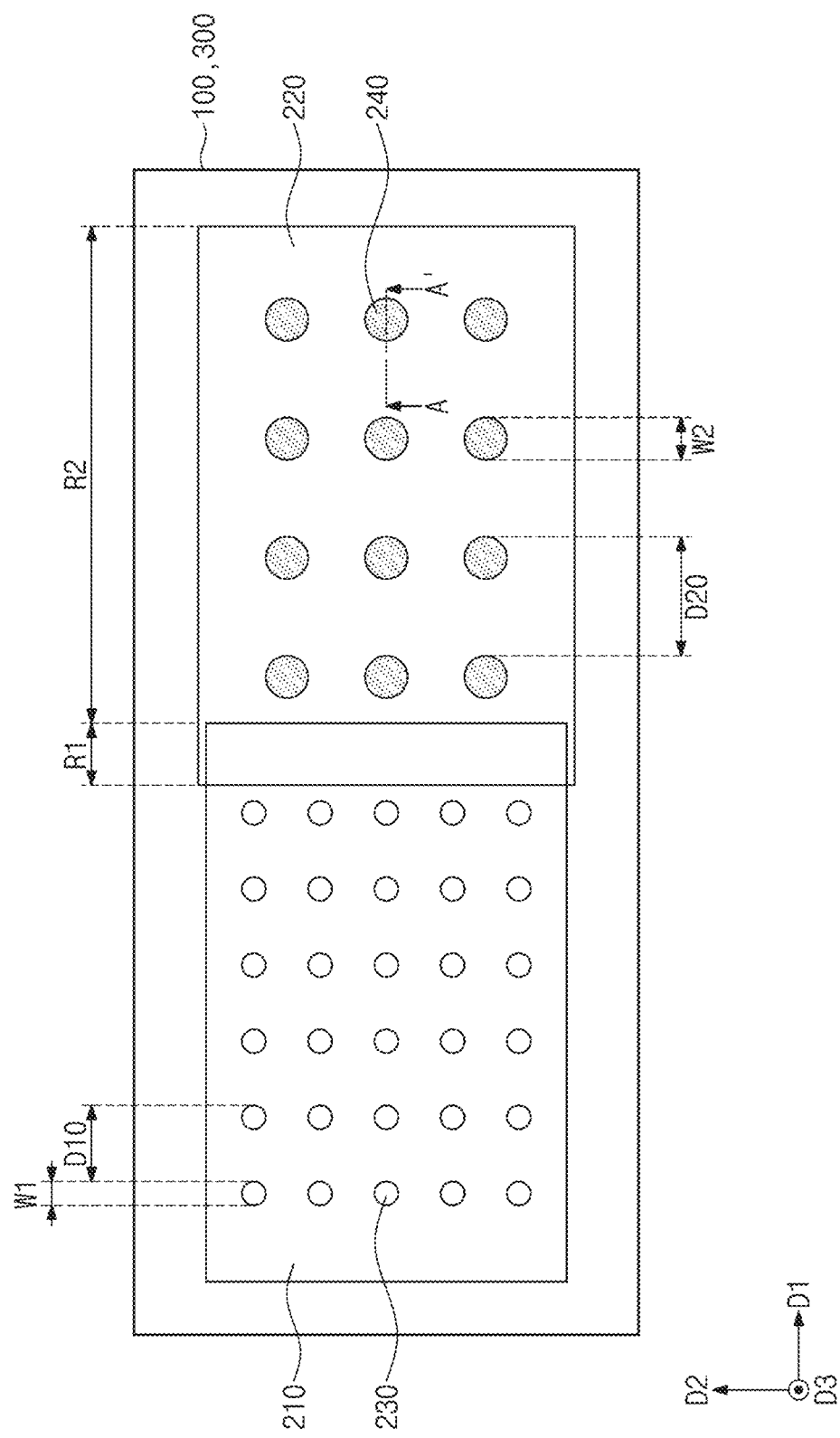
FIG. 2 illustrates a simplified plan view showing the semiconductor package of FIG. 1 according to some embodiments of the present inventive concepts.
Figure 3:
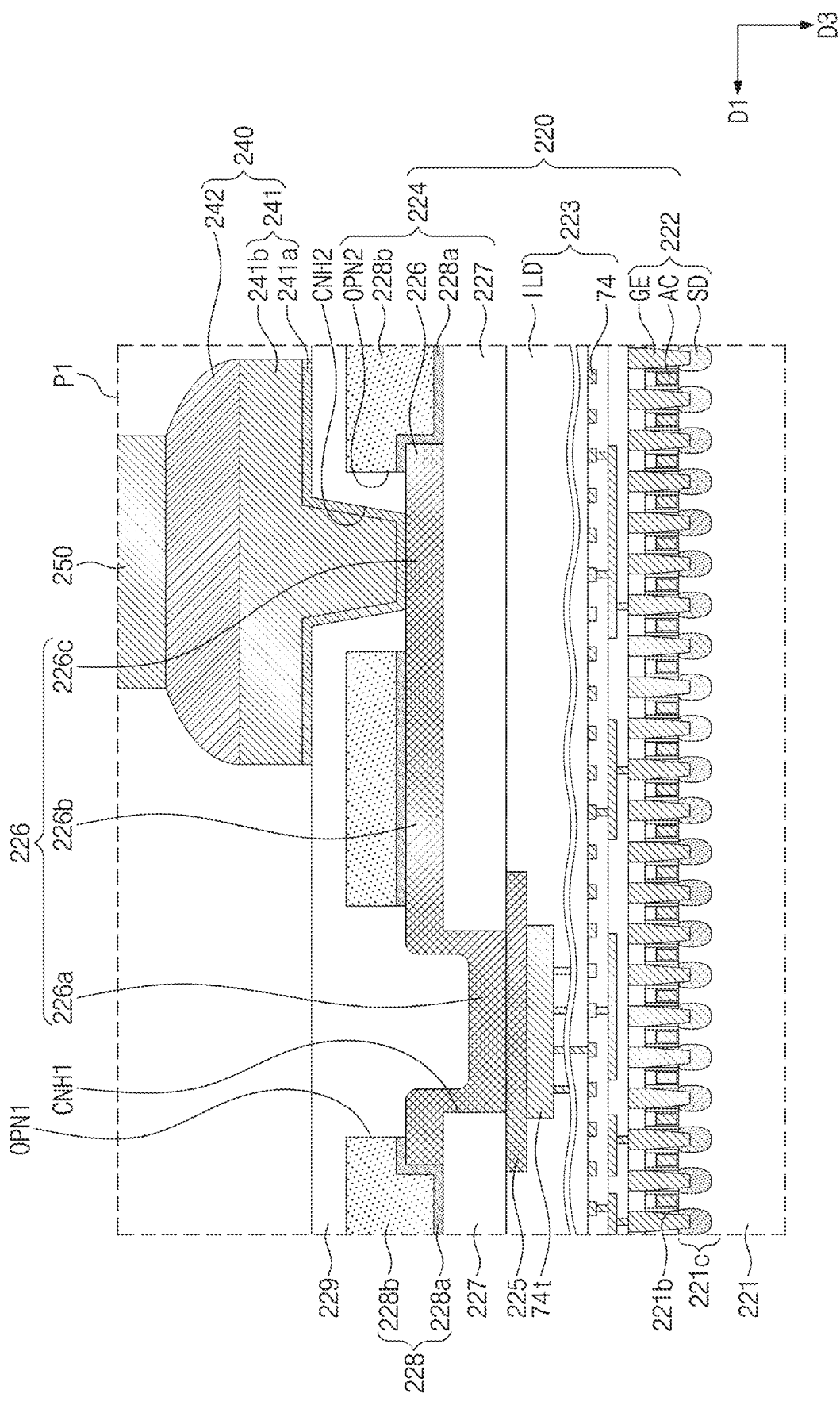
FIG. 3 illustrates an enlarged cross-sectional view showing section P1 of FIG. 1 or taken along line A-A' of FIG. 2.

FIG. 1 illustrates a cross-sectional view showing a semiconductor package according to some embodiments of the present inventive concepts. FIG. 2 illustrates a simplified plan view showing the semiconductor package of FIG. 1 according to some embodiments of the present inventive concepts. FIG. 3 illustrates an enlarged cross-sectional view showing section P1 of FIG. 1 or taken along line A-A' of FIG. 2.

Referring to FIG. 1, a semiconductor package according to some embodiments of the present inventive concepts may include a first redistribution substrate 100. The first redistribution substrate 100 may include redistribution dielectric layers 101, 102, and 103, a first redistribution pattern 110, a second redistribution pattern 120, and a third redistribution pattern 130.

The first redistribution substrate 100 may have a first surface 100a and a second surface 100b that are opposite to each other. For example, the first surface 100a of the first redistribution substrate 100 may be a top surface of the first redistribution substrate 100, and the second surface 100b of the first redistribution substrate 100 may be a bottom surface of the first redistribution substrate 100.

The redistribution dielectric layers 101, 102, and 103 may include a first redistribution dielectric layer 101, a second redistribution dielectric layer 102, and a third redistribution dielectric layer 103 that are sequentially stacked in a direction from the second surface 100b toward the first surface 100a of the first redistribution substrate 100. For example, the first, second, and third redistribution dielectric layers 101, 102, and 103 may be sequentially stacked in a direction (e.g., a third direction D3) perpendicular to the first surface 100a of the first redistribution substrate 100. The first redistribution substrate 100 may be called a wiring structure. The first surface 100a of the first redistribution substrate 100 may be a top surface of the third redistribution dielectric layer 103. The second surface 100b of the first redistribution substrate 100 may be a bottom surface of the first redistribution dielectric layer 101.

The first redistribution pattern 110 may be disposed on the first redistribution dielectric layer 101. The first redistribution pattern 110 may be provided on a bump pattern 350 which will be discussed below. The first redistribution dielectric layer 101 may be a lowermost redistribution dielectric layer. The first redistribution pattern 110 may have a bottom surface located at substantially a same level as that of the second surface 100b of the first redistribution substrate 100. The first redistribution dielectric layer 101 may include, for example, a photo-imageable dielectric (PID) resin or an organic material such as photo-imageable polymer. In this description, the photo-imageable polymer may include, for example, at least one selected from photosensitive polyimide, polybenzoxazole, phenolic polymers, and benzocyclobutene polymers.

The second redistribution dielectric layer 102 may be disposed on the first redistribution dielectric layer 101. The second redistribution dielectric layer 102 may include a same material as that of the first redistribution dielectric layer 101. For example, the second redistribution dielectric layer 102 may include a photo-imageable dielectric resin or an organic material such as photo-imageable polymer.

The first redistribution pattern 110 may include a first via part 110V and a first wire part 110W. The first wire part 110W may be disposed in the second redistribution dielectric layer 102. The first wire part 110W may be disposed on a top surface of the first redistribution dielectric layer 101. The first wire part 110W may be in contact with the second redistribution pattern 120 which will be discussed below. The first via part 110V may be in contact with a bump pattern 350 which will be discussed below. The first via part 110V may be connected to the first wire part 110W. The first via part 110V may be a portion that protrudes from the first wire part 110W in a direction perpendicular to the first surface 100a of the first redistribution substrate 100. For example, the first via part 110V may be a portion that protrudes from the first wire part 110W in a direction from the first surface 100a toward the second surface 100b of the first redistribution substrate 100. The first wire part 110W may have a width or length greater than that of the first via part 110V. The first via part 110V may be provided in the first redistribution dielectric layer 101.

The first redistribution pattern 110 may include a first seed pattern 111 and a first conductive layer 113. The first conductive layer 113 may be provided on the top surface of the first redistribution dielectric layer 101 and in the first redistribution dielectric layer 101. The first conductive layer 113 may include metal, such as copper. The first seed pattern 111 may be interposed between the first conductive layer 113 and the first redistribution dielectric layer 101 and between the first conductive layer 113 and a bump pattern 350 which will be discussed below. The first seed pattern 111 may be in contact with a bump pattern 350 which will be discussed below. The first seed pattern 111 may include a conductive material, such as one or more of copper, titanium, and any alloy thereof.

The first via part 110V and the first wire part 110W may each include the first seed pattern 111 and the first conductive layer 113. The first seed pattern 111 of the first via part 110V and the first seed pattern 111 of the first wire part 110W may be directly connected to each other without a boundary therebetween. The first seed pattern 111 may be provided between a bottom surface of the first conductive layer 113 of the first via part 110V and a bump pattern 350 which will be discussed below, between a sidewall of the first conductive layer 113 of the first via part 110V and the first redistribution dielectric layer 101, and between a bottom surface of the first conductive layer 113 of the first wire part 110W and the first redistribution dielectric layer 101. The first seed pattern 111 may not extend on a sidewall or a top surface of the first conductive layer 113 of the first wire part 110W. The first conductive layer 113 of the first via part 110V may be directly connected to the first conductive layer 113 of the first wire part 110W.

The second redistribution pattern 120 may be disposed on the first redistribution pattern 110. The second redistribution pattern 120 may be electrically coupled to the first redistribution pattern 110.

The third redistribution dielectric layer 103 may be disposed on the second redistribution dielectric layer 102. The third redistribution dielectric layer 103 may include a same material as that of the first redistribution dielectric layer 101. For example, the third redistribution dielectric layer 103 may include a photo-imageable dielectric resin or an organic material such as photo-imageable polymer.

The second redistribution pattern 120 may include a second via part 120V and a second wire part 120W. The second wire part 120W may be disposed in the third redistribution dielectric layer 103. The second wire part 120W may be disposed on a top surface of the second redistribution dielectric layer 102. The second wire part 120W may be in contact with the third redistribution pattern 130 which will be discussed below. The second via part 120V may be in contact with the first redistribution pattern 110 while being connected to the second wire part 120W. The second via part 120V may be a portion that protrudes from the second wire part 120W in a direction perpendicular to the first surface 100*a* of the first redistribution substrate 100. For example, the second via part 120V may be a portion that protrudes from the second wire part 120W in a direction from the first surface 100*a* toward the second surface 100*b* of the first redistribution substrate 100. The second wire part 120W may have a width or length greater than that of the second via part 120V. The second via part 120V may be provided in the second redistribution dielectric layer 102.

The second redistribution pattern 120 may include a second seed pattern 121 and a second conductive layer 123. The second conductive layer 123 may be provided on the top surface of the second redistribution dielectric layer 102 and in the second redistribution dielectric layer 102. The second conductive layer 123 may include metal, such as copper. The second seed pattern 121 may be interposed between the first redistribution pattern 110 and the second conductive layer 123 and between the second redistribution dielectric layer 102 and the second conductive layer 123. The second seed pattern 121 may be in contact with the first redistribution pattern 110. The second seed pattern 121 may include a conductive material, such as one or more of copper, titanium, and any alloy thereof.

The second via part 120V and the second wire part 120W may each include the second seed pattern 121 and the second conductive layer 123. The second seed pattern 121 of the second via part 120V and the second seed pattern 121 of the second wire part 120W may be directly connected to each other without a boundary therebetween. The second seed pattern 121 may be provided between a bottom surface of the second conductive layer 123 of the second via part 120V and the first redistribution pattern 110, between a sidewall of the second conductive layer 123 of the second via part 120V and the second redistribution dielectric layer 102, and between a bottom surface of the second conductive layer 123 of the second wire part 120W and the second redistribution dielectric layer 102. The second seed pattern 121 may not extend on a sidewall or a top surface of the second conductive layer 123 of the second wire part 120W. The second conductive layer 123 of the second via part 120V may be directly connected to the second conductive layer 123 of the second wire part 120W.

The third redistribution pattern 130 may be disposed on the second redistribution pattern 120. The third redistribution pattern 130 may be electrically coupled to the second redistribution pattern 120.

The third redistribution pattern 130 may include a third via part 130V and a third wire part 130W. The third wire part 130W may be disposed on a top surface of the third redistribution dielectric layer 103. The third wire part 130W may be disposed in a molding layer 300 which will be discussed below. The third wire part 130W may be in contact with connection terminals 230 or conductive pillars 250 which will be discussed below. The third via part 130V may be in contact with the second redistribution pattern 120 while being connected to the third wire part 130W. The third via part 130V may be a portion that protrudes from the third wire part 130W in a direction perpendicular to the first surface 100*a* of the first redistribution substrate 100. For example, the third via part 130V may be a portion that protrudes from the third wire part 130W in a direction from the first surface 100*a* toward the second surface 100*b* of the first redistribution substrate 100. The third wire part 130W may have a width or length greater than that of the third via part 130V. The third via part 130V may be provided in the third redistribution dielectric layer 103.

The third redistribution pattern 130 may include a third seed pattern 131 and a third conductive layer 133. The third conductive layer 133 may be provided on the top surface of the third redistribution dielectric layer 103 and in the third redistribution dielectric layer 103. The third conductive layer 133 may include metal, such as copper. The third seed pattern 131 may be interposed between the second redistribution pattern 120 and the third conductive layer 133 and between the third redistribution dielectric layer 103 and the third conductive layer 133. The third seed pattern 131 may be in contact with the second redistribution pattern 120. The third seed pattern 131 may include a conductive material, such as one or more of copper, titanium, and any alloy thereof.

Each of the first, second, and third via parts 110V, 120V, and 130V may have a width that decreases in a direction from the first surface 100a toward the second surface 100b of the first redistribution substrate 100.

A first semiconductor chip 210 may be disposed on the first surface 100a of the first redistribution substrate 100. The first semiconductor chip 210 may have an inactive surface 210a and an active surface 210b that are opposite to each other. The first semiconductor chip 210 may include an active section 210c adjacent to the active surface 210b thereof. The active section 210c of the first semiconductor chip 210 may include a plurality of transistors included in an integrated circuit. The first semiconductor chip 210 may be either a memory chip such as dynamic random access memory (DRAM) and VNAND (vertical NAND Flash memory) or a logic chip such system-on-chip (SOC).

The first semiconductor chip 210 and the first redistribution substrate 100 may be provided with connection terminals 230 therebetween. For example, the connection terminals 230 may be interposed between the third redistribution pattern 130 and the first semiconductor chip 210. The connection terminals 230 may include solders, bumps, pillars, or any combination thereof. For example, the connection terminals 230 may include a solder material. The first semiconductor chip 210 may be electrically connected through the connection terminals 230 to the first redistribution substrate 100.

A second semiconductor chip 220 may be disposed above the first surface 100a of the first redistribution substrate 100. The second semiconductor chip 220 may be disposed above the first semiconductor chip 210. The second semiconductor chip 220 may be located at a higher level than that of the first semiconductor chip 210. A portion of the second semiconductor chip 220 may vertically overlap the first semiconductor chip 210. The second semiconductor chip 220 may be either a memory chip such as dynamic random access memory (DRAM) and VNAND (vertical NAND Flash memory) or a logic chip such system-on-chip (SOC).

Referring to FIG. 3, the second semiconductor chip 220 may include a semiconductor substrate 221 and may also include a device layer 222, a wiring layer 223, and a redistribution layer 224. The semiconductor substrate 221 may include an inactive surface 221a and an active surface 221b that are opposite to each other. The semiconductor substrate 221 may include an active section 221c adjacent to the active surface 221b thereof.

The device layer 222 may include a plurality of source/drain patterns SD in the active section 221c of the semiconductor substrate 221, a plurality of gate electrodes GE on the active section 221c of the semiconductor substrate 221, and a plurality of active contacts AC correspondingly connected to the source/drain patterns SD. The gate electrodes GE may be provided on the active surface 221b of the semiconductor substrate 221. Each of the gate electrodes GE may be interposed between a pair of neighboring source/drain patterns SD. A plurality of transistors may be constituted by the active section 221c that includes the gate electrodes GE and the source/drain patterns SD.

The transistors and the contacts AC may be formed by a front-end-of-line process in fabrication of the second semiconductor chip 220. For example, the transistors and the contacts AC may constitute a front-end-of-line (FEOL) process structure of the second semiconductor chip 220.

The wiring layer 223 may be provided on the device layer 222. The wiring layer 223 may include intermetallic dielectric layers ILD that are sequentially stacked, wiring lines 74 interposed between the sequentially stacked intermetallic dielectric layers ILD, and a conductive pad 225 connected to an uppermost one 74t of the wiring lines 74. The intermetallic dielectric layer ILD may cover the device layer 222. The intermetallic dielectric layers ILD may include, for example, silicon oxide. The wiring lines 74 and the conductive pad 225 may each include at least one metal selected from, for example, aluminum, copper, tungsten, molybdenum, and cobalt. The conductive pad 225 may be disposed in an uppermost one of the intermetallic dielectric layers ILD. A top surface of the conductive pad 225 may be exposed by the uppermost intermetallic dielectric layer ILD.

The wiring layer 223 may be provided on the redistribution layer 224. The redistribution layer 224 may include a fourth redistribution dielectric layer 227 that covers the wiring layer 223, a fourth redistribution pattern 226 that penetrates the fourth redistribution dielectric layer 227 to connect with the conductive pad 225 and extends onto the fourth redistribution dielectric layer 227, and a fifth redistribution dielectric layer 228 that covers the fourth redistribution dielectric layer 227 and the fourth redistribution pattern 226.

The fourth redistribution dielectric layer 227 may include a first contact hole CNH1 that exposes at least a portion of the top surface of the conductive pad 225. The fourth redistribution dielectric layer 227 may include a silicon oxide layer or a silicon oxynitride layer. In some embodiments of the present inventive concepts, the fourth redistribution dielectric layer 227 may include a plurality of stacked dielectric layers.

At least one fourth redistribution pattern 226 may be disposed on the fourth redistribution dielectric layer 227. The fourth redistribution pattern 226 may include a contact part 226a that fills at least one of the first contact hole CNH1, a pad part 226c connected to a conductive bump pattern 241 which will be discussed below, and a line part 226b that extends from the contact part 226a toward the pad part 226c.

The fourth redistribution pattern 226 may be connected through the contact part 226a to the conductive pad 225. The contact part 226a may include on its upper portion a recess region while filling the first contact hole CNH1. For example, the recess region may have a bottom surface lower than a top surface of the fourth redistribution dielectric layer 227.

The line part 226b may have a linear shape that extends in a first direction D1 on a top surface of the fourth redistribution dielectric layer 227. The line part 226b may have a thickness substantially equal to that of the contact part 226a.

The fourth redistribution pattern 226 may include a metallic material that can be subject to deposition and etching processes. For example, the fourth redistribution pattern 226 may include aluminum (Al).

The fifth redistribution dielectric layer 228 may be provided on the fourth redistribution pattern 226. The fifth redistribution dielectric layer 228 may cover the top surface of the fourth redistribution dielectric layer 227, which top surface is not covered with the fourth redistribution pattern 226. The fifth redistribution dielectric layer 228 may include a first opening OPN1 that exposes the contact part 226a of the fourth redistribution pattern 226 and a second opening OPN2 that exposes the pad part 226c of the fourth redistribution pattern 226.

The fifth redistribution dielectric layer 228 may include a lower dielectric layer 228a and an upper dielectric layer 228b. The upper dielectric layer 228b may be provided on the lower dielectric layer 228a. The lower dielectric layer 228a may have a thickness less than that of the upper dielectric layer 228b. The lower dielectric layer 228a may include an inorganic dielectric material, such as silicon nitride, silicon oxide, silicon oxynitride, or aluminum oxide. The upper dielectric layer 228b may include an organic polymer layer. For example, the upper dielectric layer 228b may include polyimide, resin, or synthetic rubber. The lower dielectric layer 228a may serve as, for example, an adhesion promoter layer between the upper dielectric layer 228b and the fourth redistribution dielectric layer 227.

The wiring layer 223 and the redistribution layer 224 may constitute a back-end-of-line process structure. For example, the wiring layer 223 and the redistribution layer 224 may be formed by a back-end-of-line (BEOL) process in fabrication of the second semiconductor chip 220

A dielectric film 229 may be provided on the fifth redistribution dielectric layer 228. The dielectric film 229 may fill the first and second openings OPN1 and OPN2 of the fifth redistribution dielectric layer 228. For example, the dielectric film 229 may include an organic polymer layer.

The dielectric film 229 may include a second contact hole CNH2 that exposes at least a portion of a top surface of the pad part 226c included in the fourth redistribution pattern 226. The second contact hole CNH2 may be formed in the dielectric film 229 that fills the second opening OPN2. The second contact hole CNH2 may have a diameter less than that of the second opening OPN2.

The dielectric film 229 may be provided thereon with an external connection member 240 connected to the fourth redistribution pattern 226. The external connection member 240 may include a conductive bump pattern 241 and a solder pattern 242 on the conductive bump pattern 241. The dielectric film 229 may be provided thereon with the conductive bump pattern 241 that fills the second contact hole CNH2. For example, the conductive bump pattern 241 may be connected through the second contact hole CNH2 to the pad part 226c of the fourth redistribution pattern 226. The dielectric film 229 may separate the conductive bump pattern 241 in the second contact hole CNH2 from the fifth redistribution dielectric layer 228.

The conductive bump pattern 241 may include a seed pattern 241a and a conductive pattern 241b on the seed pattern 241a. The seed pattern 241a may cover a bottom surface of the conductive pattern 241b. The seed pattern 241a may be interposed between the dielectric film 229 and the conductive pattern 241b. For example, the seed pattern 241a may include a conductive material, such as copper, titanium, or any alloy thereof. The seed pattern 241a may serve as a barrier layer to prevent or reduce diffusion of metal contained in the conductive pattern 241b. For example, the conductive pattern 241b may include copper.

The solder pattern 242 of the external connection member 240 may be disposed on the conductive bump pattern 241. The conductive bump pattern 241 may serve as a pad for the solder pattern 242. The formation of the solder pattern 242 may include performing attaching a solder ball on the conductive bump pattern 241.

The dielectric film 229 and the external connection member 240 may be formed in a package process, or a Post-FAB process. According to some embodiments of the present inventive concepts, the redistribution layer 224 including the fourth redistribution pattern 226 may be formed not through a post-FAB process, but through an In-FAB process (e.g., a back-end-of-line process of the second semiconductor chip 220). In this case, because the redistribution layer 224 is formed by using a fabrication process for a semiconductor chip, there may be an advantage that the redistribution layer 224 is formed in an In-FAB process without requiring additional equipment investment.

Referring back to FIG. 1, conductive pillars 250 may be provided which electrically connect the second semiconductor chip 220 to the first redistribution substrate 100. For example, the conductive pillars 250 may vertically extend between the external connection member 240 and the third redistribution pattern 130. Each of the conductive pillars 250 may have a top surface in direct contact with the solder pattern 242 of the external connection member 240. The conductive pillars 250 may be disposed in a molding layer 300 which will be discussed below. Each of the conductive pillars 250 may include a metallic material, such as copper or tungsten.

A molding layer 300 may cover the first semiconductor chip 210 and the second semiconductor chip 220. The molding layer 300 may cover a top surface and sidewalls of the first semiconductor chip 210 and also cover a top surface and sidewalls of the second semiconductor chip 220. The molding layer 300 may be provided between the first semiconductor chip 210 and the first redistribution substrate 100, between the second semiconductor chip 220 and the first redistribution substrate 100, and between the first semiconductor chip 210 and the second semiconductor chip 220. The molding layer 300 may be in contact with a sidewall of the conductive pillar 250. The molding layer 300 may include a dielectric polymer, such as an epoxy-based polymer.

The first redistribution substrate 100 may be provided on its second surface 100b with a plurality of bump patterns 350 and a plurality of external terminals 400. Each of the bump patterns 350 may be electrically connected to the first redistribution pattern 110. Each of the bump patterns 350 may include a conductive metallic material. The external terminals 400 may be correspondingly provided below the bump patterns 350. Although not shown, the external terminals 400 may be connected to an external substrate (e.g., printed circuit board). For example, the external terminals 400 may be solder balls.

Referring to FIG. 2, the second semiconductor chip 220 may include a first region R1 that vertically overlaps the first semiconductor chip 210 and a second region R2 that is horizontally offset from the first semiconductor chip 210. The external connection members 240 may be disposed on the second region R2 of the second semiconductor chip 220. The external connection members 240 may not be disposed on the first region R1 of the second semiconductor chip 220. For example, the external connection members 240 may be horizontally offset from the first semiconductor chip 210. The connection terminals 230 may be horizontally offset from the second semiconductor chip 220. Alternatively, at least one of the connection terminals 230 may vertically overlap the second semiconductor chip 220. Although not shown, the connection terminals 230 and the external connection members 240 may be freely changed in terms of number and arrangement.

According to some embodiments of the present inventive concepts, the second semiconductor chip 220 may be located at a higher level than that of the first semiconductor chip 210. The conductive pillars 250 may be used such that the second semiconductor chip 220 is disposed to allow its portion to vertically overlap the first semiconductor chip 210. Therefore, a semiconductor package may have a size that is smaller in a case where the second semiconductor chip 220 is disposed to allow its portion to vertically overlap the first semiconductor chip 210 than in a case where the second semiconductor chip 220 is located at a same level as that of the first semiconductor chip 210. As a result, a compact-sized semiconductor package may be provided.

Referring again to FIG. 1, a first pitch D10 may be given as a pitch between the connection terminals 230. A second pitch D20 may be given as a pitch between the external connection members 240. A third pitch D30 may be given as a pitch between the external terminals 400. The second pitch D20 may be greater the first pitch D10. The third pitch D30 may be greater than the second pitch D20. A fourth pitch D40 may be given as a pitch between the conductive pillars 250. The fourth pitch D40 may be substantially equal to the second pitch D20.

A first width W1 may be given as a maximum width of the connection terminal 230. A second width W2 may be given as a maximum width of the external connection member 240. The second width W2 may be greater than the first width W1.

According to some embodiments of the present inventive concepts, an In-FAB process may be used to form the redistribution layer 224 of the second semiconductor chip 220. Therefore, it may be possible that the external connection members 240 are formed to allow their pitch to correspond to that of the conductive pillars 250 without forming an additional redistribution substrate. As a result, the conductive pillars 250 may be used to facilitate a reduction in size of a semiconductor package.

A first distance H1 may be given as a vertical distance between the conductive pillar 250 and the semiconductor substrate 221 of the second semiconductor chip 220. The first distance H1 may be a minimum distance between the active surface 221b of the semiconductor substrate 221 and a top surface of the conductive pillar 250. For example, the first distance H1 may range from about 5 μm to about 10 μm. A second distance H2 may be given as a vertical distance between the first semiconductor chip 210 and the external terminal 400. For example, the second distance H2 may be a maximum distance between the external terminal 400 and the active surface 210b of the first semiconductor chip 210.

As no redistribution substrate is separately formed when the second semiconductor chip 220 is connected to the conductive pillars 250, the first distance H1 may become less than the second distance H2. When forming a redistribution substrate including a photo-imageable dielectric (PID) resin or an organic material such as a photo-imageable polymer, because it is essential to apply high-temperature heat in fabrication process, there may be a problem of reduction in performance of a semiconductor chip. According to some embodiments of the present inventive concepts, because the redistribution layer 224 of the second semiconductor chip 220 is formed in an In-FAB process, a semiconductor chip may be prevented or reduced from performance deterioration caused by high-temperature heat. Accordingly, a semiconductor package may improve in electrical properties. In addition, it may be possible to omit the formation of redistribution patterns by using a plating process in a Post-FAB process and as a result to achieve simplification of the fabrication process.

Figure 4:
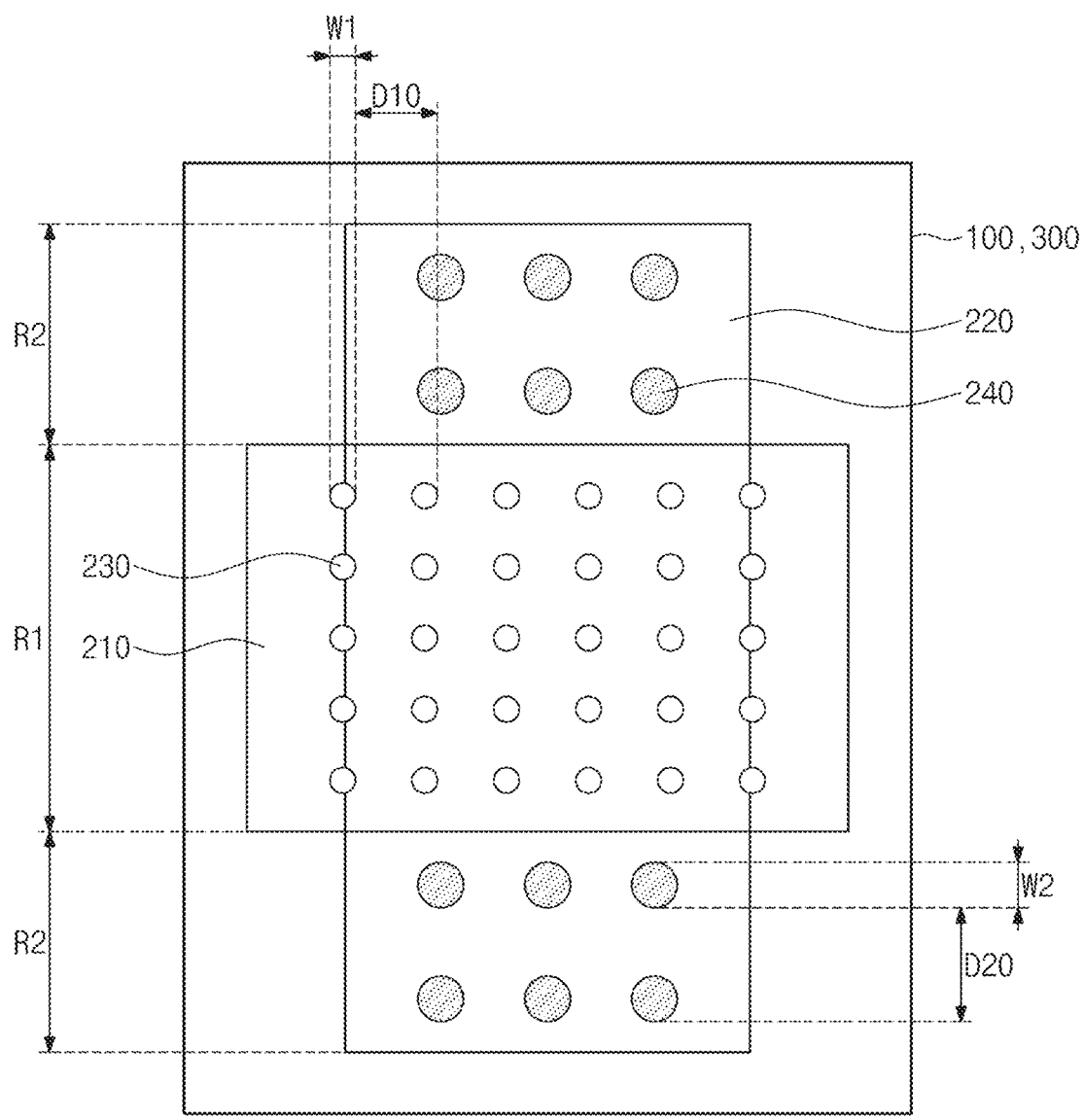
FIG. 4 illustrates a simplified plan view showing a semiconductor package according to some embodiments of the present inventive concepts.

FIG. 4 illustrates a simplified plan view showing a semiconductor package according to some embodiments of the present inventive concepts.

Referring to FIG. 4, when viewed in plan, the first semiconductor chip 210 and the second semiconductor chip 220 may intersect each other. For example, the first semiconductor chip 210 may extend in a first direction D1, and the second semiconductor chip 220 may extend in a second direction D2.

The second semiconductor chip 220 may include a first region R1 that vertically overlaps the first semiconductor chip 210 and a second region R2 that is horizontally offset from the first semiconductor chip 210. The second region R2 may include a plurality of second regions R2. The plurality of second regions R2 may be adjacent in the second direction D2 to the first region R1. The first region R1 may be provided between the plurality of second regions R2.

The external connection members 240 may be horizontally offset from the first semiconductor chip 210. The external connection members 240 may be disposed on the plurality of second regions R2. At least one of the connection terminals 230 may vertically overlap the first region R1. Differently from that shown, the first semiconductor chip 210, the second semiconductor chip 220, the connection terminals 230, and the external connection members 240 may be freely changed in terms of arrangement.

FIGS. 5A to 5L illustrate cross-sectional views showing a method of fabricating a semiconductor package according to some embodiments of the present inventive concepts. FIGS. 5A to 5E illustrate cross-sectional views of section P1 of FIG. 2 or taken along line A-A' of FIG. 3, showing a fabrication process of the second semiconductor chip 220.

Figure 5A:
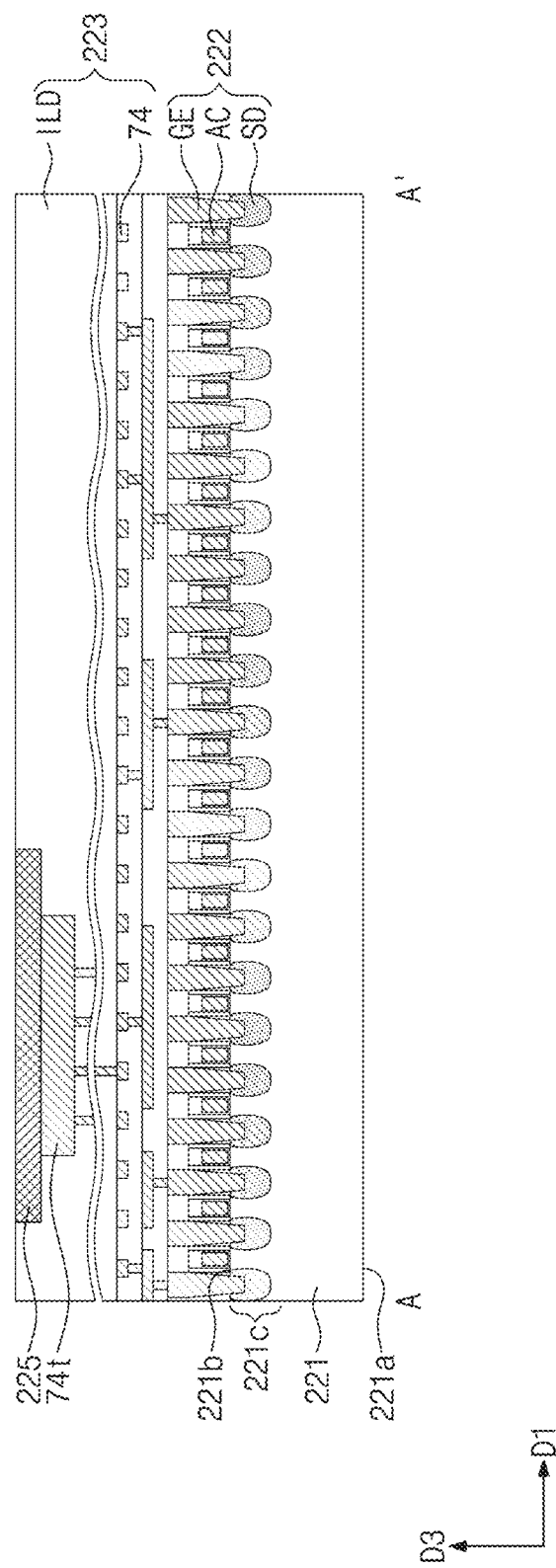

Referring to FIG. 5A, a plurality of source/drain patterns SD may be formed in an upper portion of an active section 221c on a semiconductor substrate 221. A plurality of gate electrodes GE may be formed on the active section 221c of the semiconductor substrate 221. A plurality of active contacts AC may be formed which are connected to corresponding source/drain patterns SD. Therefore, a device layer 222 may be formed on the semiconductor substrate 221.

Afterwards, a back-end-of-line process may be performed to form a wiring layer 223 on the device layer 222. For example, the formation of the wiring layer 223 may include forming intermetallic dielectric layers ILD and forming wiring lines 74 in the intermetallic dielectric layer ILD. A conductive pad 225 may be formed in an uppermost intermetallic dielectric layer ILD. A top surface of the conductive pad 225 may be exposed by the uppermost intermetallic dielectric layer ILD.

Figure 5B:
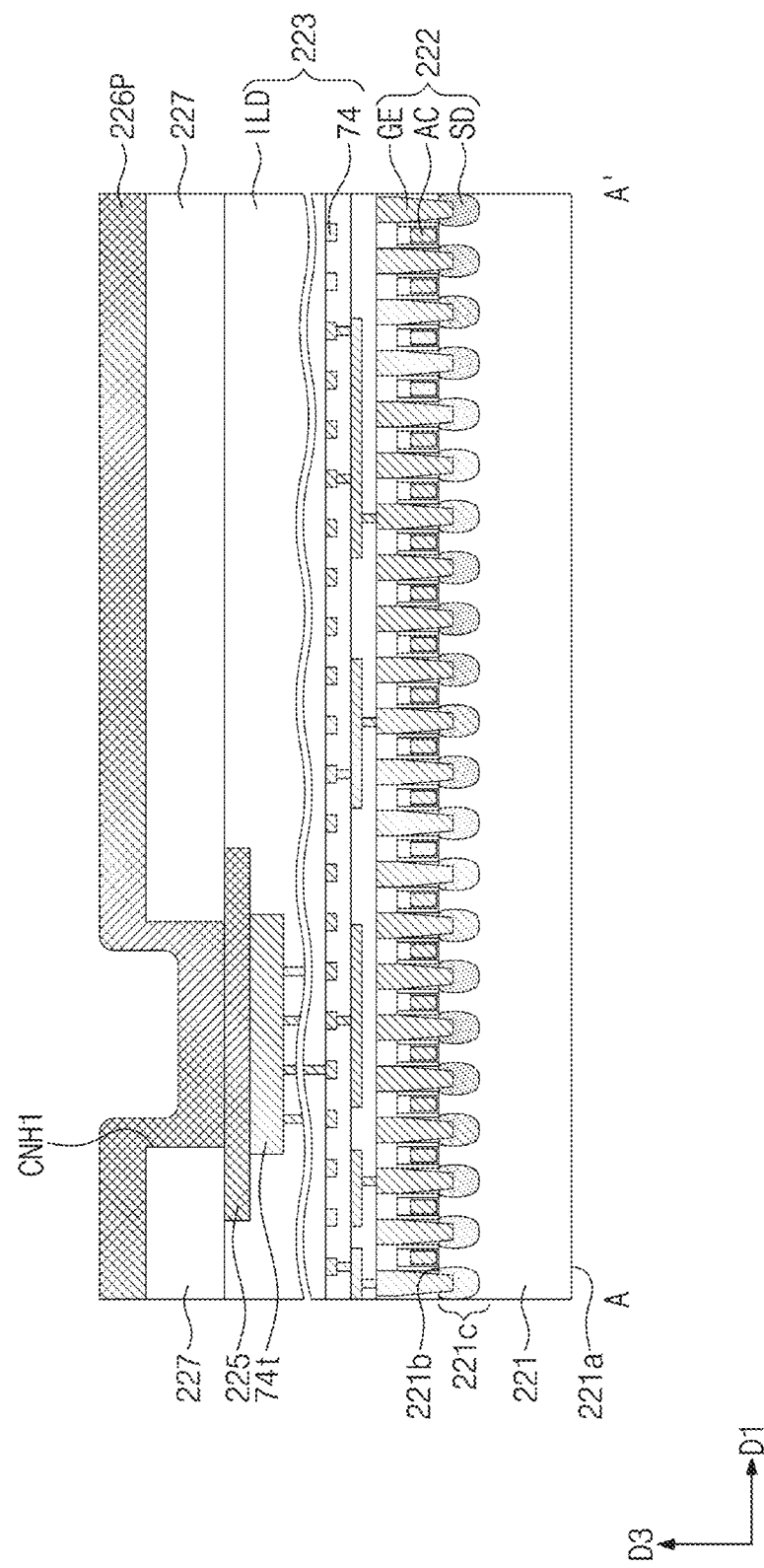

Referring to FIG. 5B, a fourth redistribution dielectric layer 227 and a preliminary redistribution pattern 226P may be formed on the wiring layer 223. For example, a deposition process may be performed to form the fourth redistribution dielectric layer 227 on the uppermost intermetallic dielectric layer ILD. The fourth redistribution dielectric layer 227 may be patterned to form a first contact hole CNH1 that exposes the conductive pad 225.

A deposition process may be performed to form the preliminary redistribution pattern 226P on the fourth redistribution dielectric layer 227. The preliminary redistribution pattern 226P may be formed by using a physical vapor deposition (PVD) process, such as sputtering. The preliminary redistribution pattern 226P may be formed also in the first contact hole CNH1, thereby being connected to the conductive pad 225. The preliminary redistribution pattern 226P may be formed of metal, such as aluminum, that can be subject to deposition.

Figure 5C:
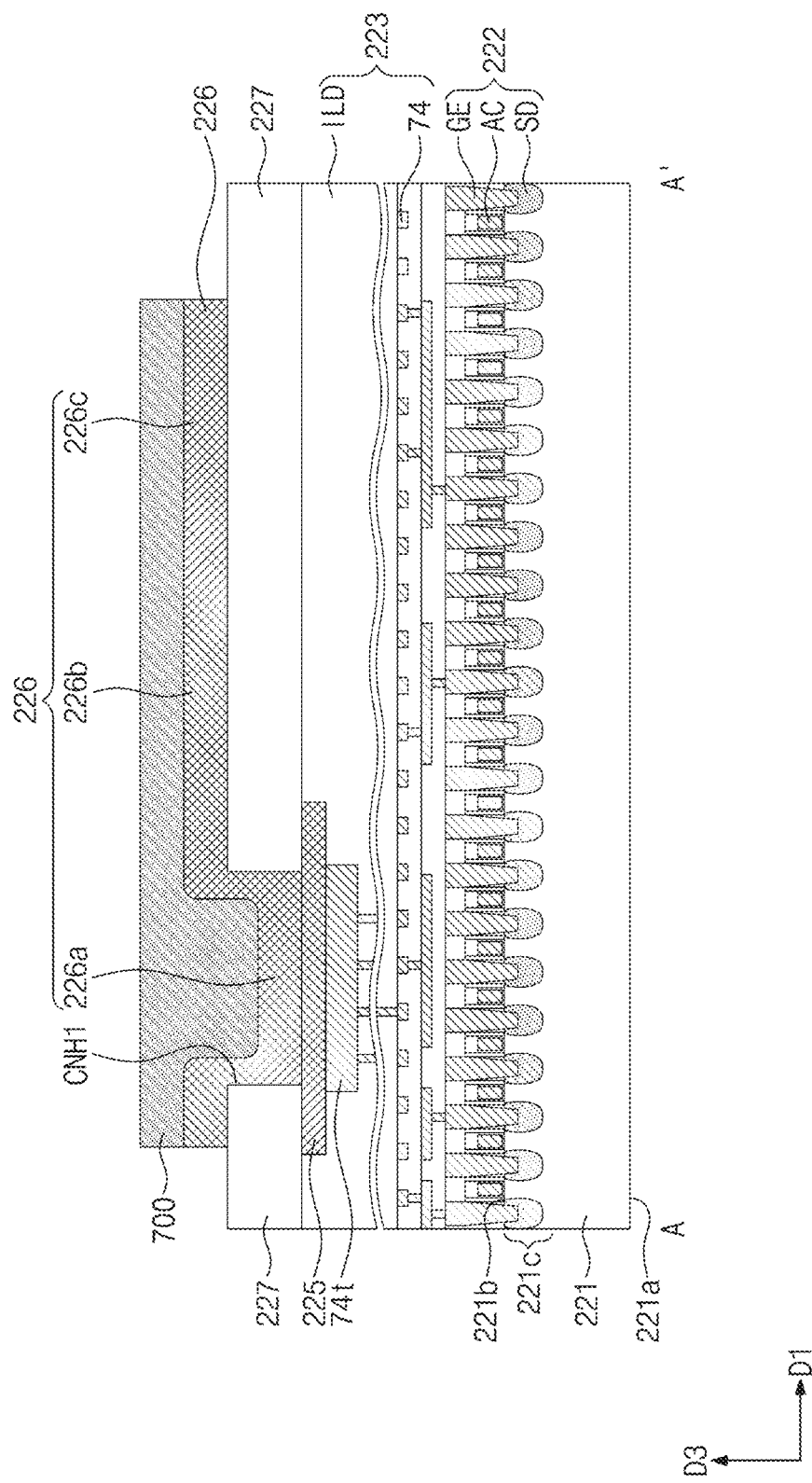

Referring to FIG. 5C, a hardmask pattern 700 may be formed on the preliminary redistribution pattern 226P. The hardmask pattern 700 may be formed by using a photolithography process. The hardmask pattern 700 may be used as an etching mask such that the preliminary redistribution pattern 226P may be patterned to form a fourth redistribution pattern 226.

A dry etching may be employed to perform a patterning process for forming the fourth redistribution pattern 226. For example, BCl3, SF6, or a combination thereof may be used as an etching gas for the dry etching. The fourth redistribution pattern 226 may include a contact part 226a in the first contact hole CNH1, a pad part 226c, and a line part 226b that extends from the contact part 226a toward the pad part 226c.

Figure 5D:
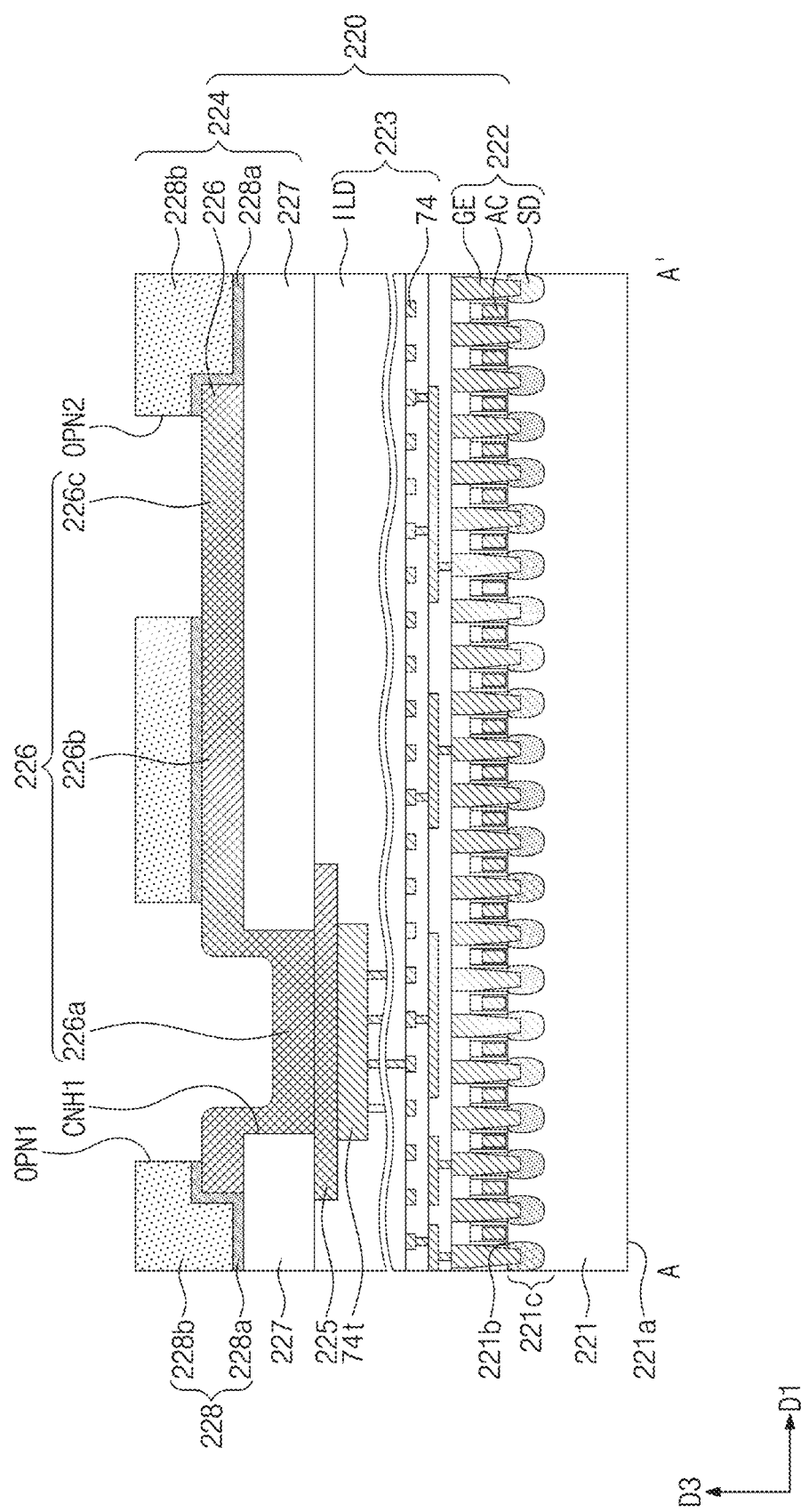

Referring to FIG. 5D, the hardmask pattern 700 may be selectively removed. A back-end-of-line process may be used to form a fifth redistribution dielectric layer 228 on the fourth redistribution pattern 226 and the fourth redistribution dielectric layer 227. The formation of the fifth redistribution dielectric layer 228 may include, for example, forming a lower dielectric layer 228a and forming an upper dielectric layer 228b on the lower dielectric layer 228a.

The lower dielectric layer 228a may be formed by using atomic layer deposition (ALD) or chemical vapor deposition (CVD). The upper dielectric layer 228b may be formed by coating on the lower dielectric layer 228a a polymeric material (e.g., polyimide, resin, or synthetic rubber) or a precursor thereof.

The fifth redistribution dielectric layer 228 may undergo a patterning process using photolithography to form a first opening OPN1 and a second opening OPN2. The first opening OPN1 may expose the contact part 226a of the fourth redistribution pattern 226, and the second opening OPN2 may expose the pad part 226c of the fourth redistribution pattern 226.

A redistribution layer 224 may be eventually formed due to the formation of the fifth redistribution dielectric layer 228 having the first and second openings OPN1 and OPN2. For example, a back-end-of-line process for the second semiconductor chip 220 may be completed. The fabricated second semiconductor chip 220 may be fabricated out.

Figure 5E:
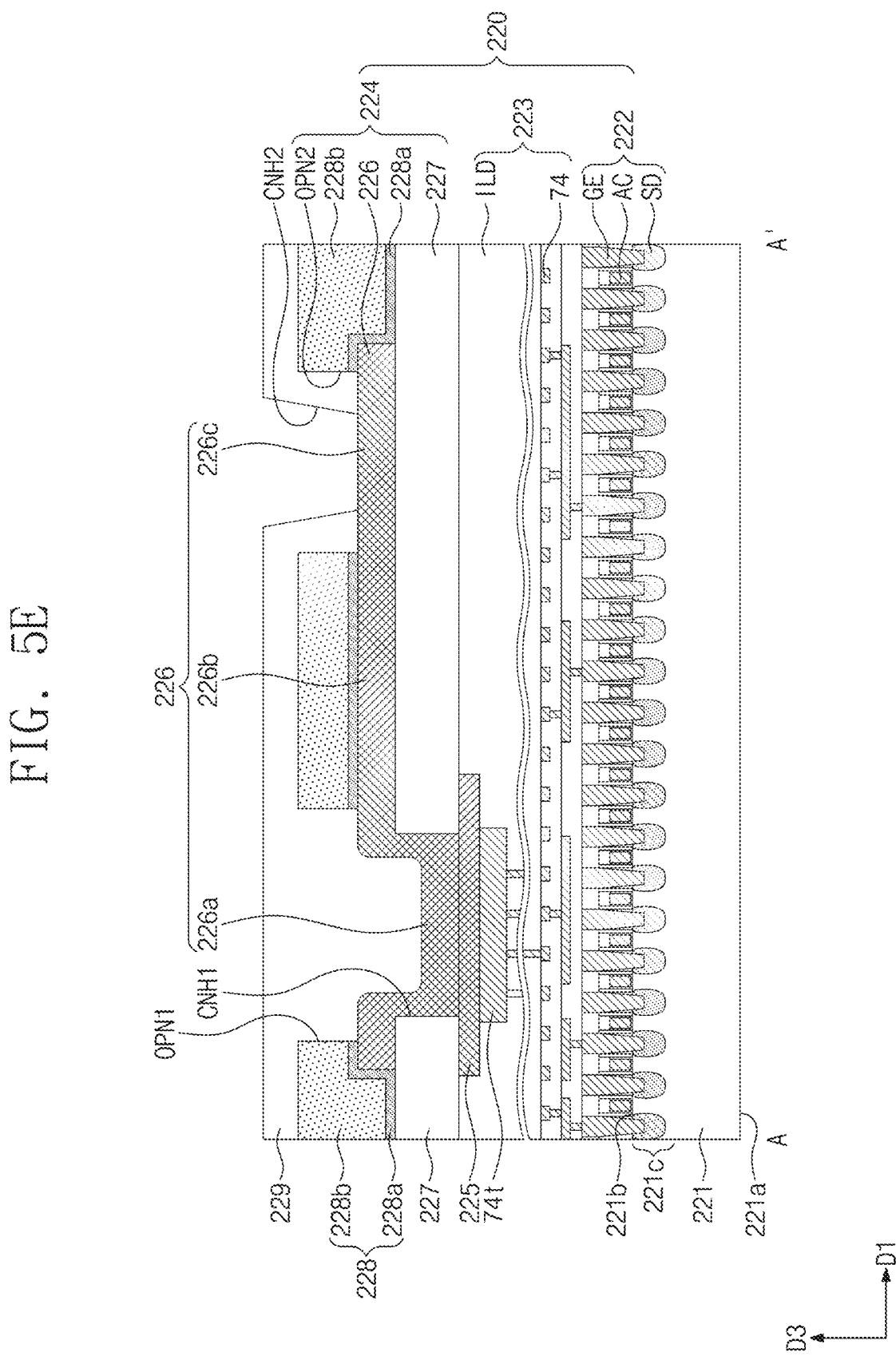

Referring to FIG. 5E, the second semiconductor chip 220, which has been fabricated out, may undergo a Post-FAB process or a package process. For example, a dielectric film 229 may be formed on the redistribution layer 224. The dielectric film 229 may be formed by coating an organic polymer material on the fifth redistribution dielectric layer 228.

The dielectric film 229 may undergo a patterning process using photolithography to form a second contact hole CNH2. The second contact hole CNH2 may be formed to penetrate the dielectric film 229 that fills the second opening OPN2. The second contact hole CNH2 may expose at least a portion of a top surface of the pad part 226c included in the fourth redistribution pattern 226.

Referring back to FIG. 3, an external connection member 240 may be formed in the Post-FAB process. For example, a seed pattern 241a may be formed in the second contact hole CNH2. A plating process may be performed to form a conductive pattern 241b on the seed pattern 241a. The seed pattern 241a and the conductive pattern 241b may constitute a conductive bump pattern 241. The conductive bump pattern 241 may undergo a solder-ball attachment process to form a solder pattern 242. The conductive bump pattern 241 and the solder pattern 242 may constitute the external connection member 240.

When a Post-FAB process is employed to form the fourth redistribution pattern 226, it may be that a plating process uses copper to form the fourth redistribution pattern 226. When the fourth redistribution pattern 226 is formed by a plating process, there may be problems such as a reduction in reliability and a requirement of additional wiring process, compared to some embodiments of the present inventive concepts.

In a method of fabricating a semiconductor package according to some embodiments of the present inventive concepts, instead of a plating process that uses gold or copper, a deposition process that uses relatively inexpensive aluminum may be adopted to perform an In-FAB process to form the fourth redistribution pattern 226. Therefore, the present inventive concepts may be more economical than a comparative example that uses a plating process. Moreover, because the fourth redistribution pattern 226 is formed by using deposition and patterning processes in place of a plating process, it may be possible to use a back-end-of-line process and its facilities for semiconductor chips. Accordingly, it may also be possible to achieve an effective semiconductor fabrication process.

Referring to FIG. 5F, a first redistribution dielectric layer 101 may be formed on a first carrier substrate 900. The first redistribution dielectric layer 101 may cover the first carrier substrate 900. The formation of the first redistribution dielectric layer 101 may be performed by a coating process, such as spin coating or slit coating. The first redistribution dielectric layer 101 may include, for example, a photo-imageable dielectric (PID) resin or an organic material such as photo-imageable polymer.

The first redistribution dielectric layer 101 may be patterned to form a first hole 109 in the first redistribution dielectric layer 101. The patterning of the first redistribution dielectric layer 101 may be performed by exposure and development processes. The first hole 109 may expose one surface of the first carrier substrate 900. The first hole 109 may have a tapered shape. For example, the first hole 109 may have a diameter that is greater at its upper portion than at its lower portion. The first hole 109 may define an inner sidewall of the first redistribution dielectric layer 101.

A first seed layer 111P, a first resist pattern 171, and first conductive layers 113 may be formed on a top surface of the first redistribution dielectric layer 101. According to some embodiments, the first seed layer 111P may conformally cover the top surface of the first redistribution dielectric layer 101, the inner sidewall of the first redistribution dielectric layer 101, and an exposed top surface of the first carrier substrate 900.

The first resist pattern 171 may be formed on the first seed layer 111P. The formation of the first resist pattern 171 may include coating a photoresist material on the first seed layer 111P. The first resist pattern 171 may be patterned to form first openings. The patterning of the first resist pattern 171 may be performed by exposure and development processes. The first openings may vertically overlap corresponding first holes 109. The first openings may have their widths greater than those of the corresponding first holes 109. Each of the first openings may have a sidewall that is substantially perpendicular to a bottom surface thereof. Each of the first openings may expose a portion of the first seed layer 111P.

The first conductive layers 113 may be formed in corresponding first holes 109, covering the first seed layer 111P. The first conductive layers 113 may fill lower portions of corresponding first openings. For example, the first conductive layers 113 may correspondingly fill the first holes 109, and may not extend onto a top surface of the first resist pattern 171. The first conductive layers 113 may be formed by performing an electroplating process in which the first seed layer 111P is used as an electrode. A planarization process may not be separately performed during the formation of the first conductive layers 113.

Figure 5G:
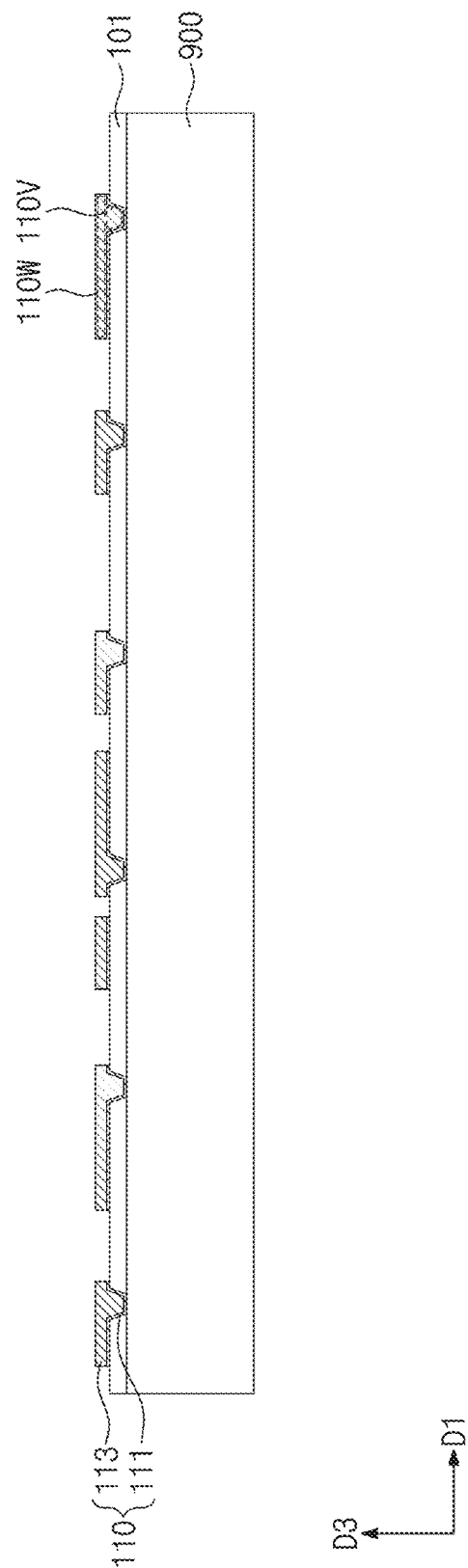

Referring to FIG. 5G, the first resist pattern 171 may be removed to expose a top surface of a first part included in the first seed layer 111P. A strip process may be performed to remove the first resist pattern 171.

The exposed first part of the first seed layer 111P may be removed to form first seed patterns 111. An etching process may be performed to remove the first part of the first seed layer 111P. A wet etching process may be adopted as the etching process. In the etching process, the first conductive layers 113 may have an etch selectivity with respect to the first seed layer 111P. The first seed layer 111P may have second parts that are disposed on bottom surfaces of the first conductive layers 113 and are not exposed to the etching process. After the etching process is terminated, the remaining second parts of the first seed layer 111P may be formed into the first seed patterns 111. Therefore, first redistribution patterns 110 may be formed. The first redistribution patterns 110 may be laterally spaced apart from each other. The first redistribution patterns 110 may include the first seed patterns 111 and the first conductive layers 113. The first conductive layers 113 may be disposed on corresponding first seed patterns 111. Each of the first redistribution patterns 110 may include a first via part 110V and a first wire part 110W. The first via part 110V may be provided in one of the first holes 109.

Figure 5H:
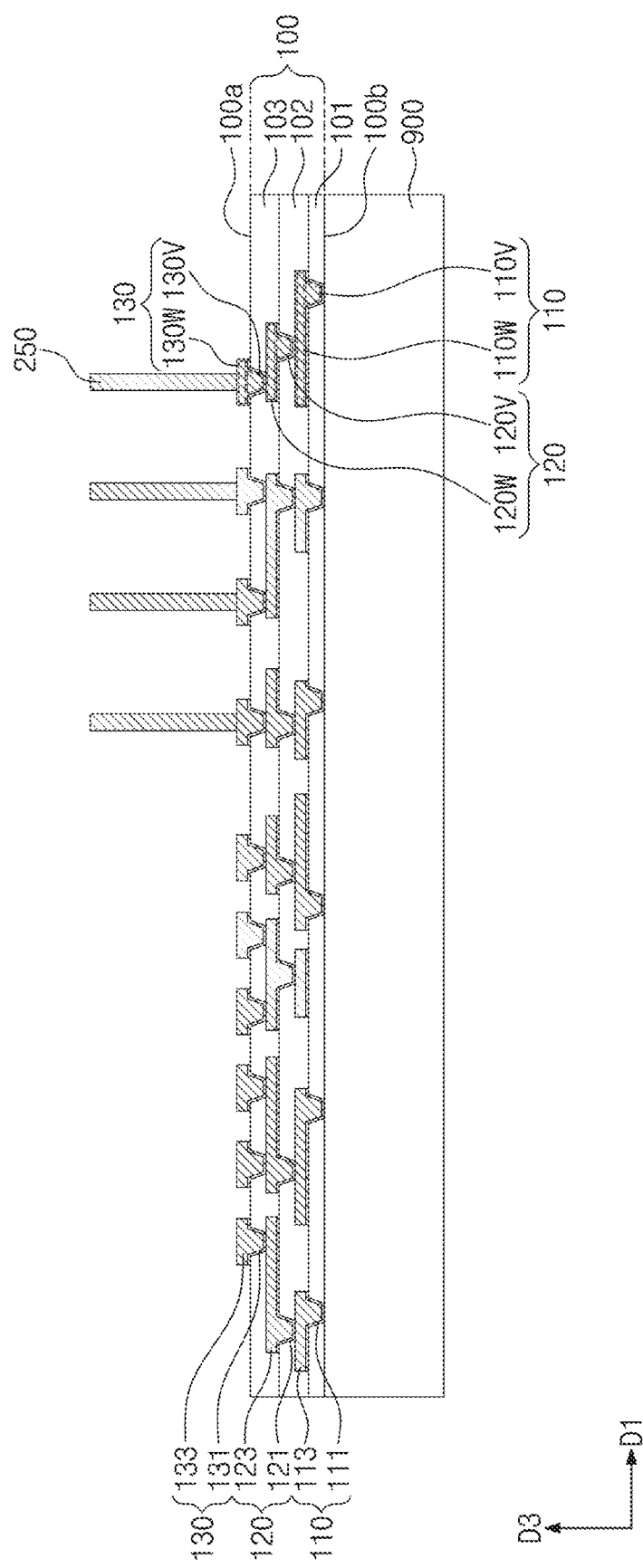

Referring to FIG. 5H, a second redistribution dielectric layer 102 may be formed on the first redistribution dielectric layer 101 to cover the first redistribution dielectric layer 101 and the first redistribution patterns 110. For example, the second redistribution dielectric layer 102 may cover top surfaces and sidewalls of the first redistribution patterns 110.

Second redistribution patterns 120 may be formed in second holes formed on the second redistribution dielectric layer 102. The second redistribution patterns 120 may extend onto a top surface of the second redistribution dielectric layer 102. The second redistribution patterns 120 may be laterally spaced apart from each other. The second redistribution patterns 120 may be formed by a same method as that used for forming the first redistribution patterns 110. For example, the formation of the second redistribution patterns 120 may include forming a second seed layer, forming on the second seed layer a second resist pattern having second openings, forming second conductive layers 123 in the second holes and the second openings, removing the second resist pattern to form a portion of the second seed layer, and etching the exposed portion of the second seed layer to form second seed patterns 121. Each of the second redistribution patterns 120 may include the second seed pattern 121 and the second conductive layer 123. The second conductive layers 123 may be disposed on corresponding second seed patterns 121. Each of the second redistribution patterns 120 may include a second via part 120V and a second wire part 120W.

A third redistribution dielectric layer 103 may be formed on the second redistribution dielectric layer 102 to cover the second redistribution dielectric layer 102 and the second redistribution patterns 120. For example, the third redistribution dielectric layer 103 may cover top surfaces and sidewalls of the second redistribution patterns 120.

The third redistribution patterns 130 may be formed in corresponding third holes formed on the third redistribution dielectric layer 103. The third redistribution patterns 130 may extend onto a top surface of the third redistribution dielectric layer 103. The third redistribution patterns 130 may be laterally spaced apart from each other. The third redistribution patterns 130 may be formed by a same method as that used for forming the first redistribution patterns 110. For example, the formation of the third redistribution patterns 130 may include forming a third seed layer, forming on the third seed layer a third resist pattern having third openings, forming third conductive layers 133 in the third holes and in the third openings, removing the third resist pattern to expose the third seed layer, and etching the exposed portion the third seed layer to form third seed patterns 131. The third redistribution patterns 130 may include the third seed patterns 131 and the third conductive layers 133. Each of the third redistribution patterns 130 may include a third via part 130V and a third wire part 130W.

A plurality of conductive pillars 250 may be formed on ones of the third redistribution patterns 130. Each of the conductive pillars 250 may include a conductive metallic material. The conductive pillars 250 may extend in a third direction D3.

Figure 5I:
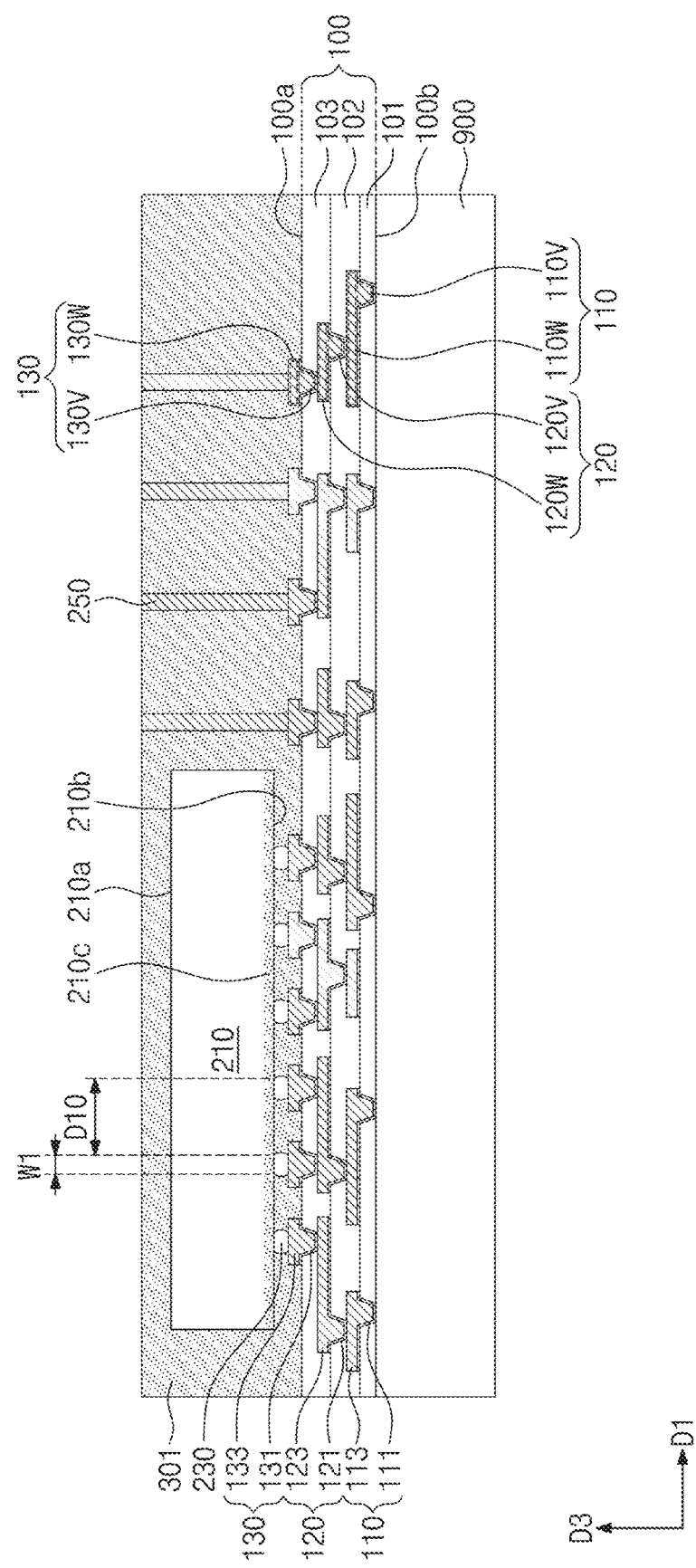

Referring to FIG. 5I, a first semiconductor chip 210 may be disposed on the first redistribution substrate 100. The first semiconductor chip 210 and the third redistribution pattern 130 may be provided with connection terminals 230 therebetween. A first pitch D10 may be given as a pitch between the connection terminals 230. A first width W1 may be given as a maximum width of the connection terminal 230.

A first molding part 301 may be formed on the first redistribution substrate 100, covering the first semiconductor chip 210. The first molding part 301 may include a dielectric polymer, such as an epoxy-based polymer. The first molding part 301 may cover the conductive pillars 250. A grinding process may be performed on the first molding part 301. Therefore, a top surface of the first molding part 301 may become planarized. The top surface of the first molding part 301 may be coplanar with that of the conductive pillar 250. The top surface of the conductive pillar 250 may be located at a higher level than that of a top surface of the first semiconductor chip 210.

Figure 5J:
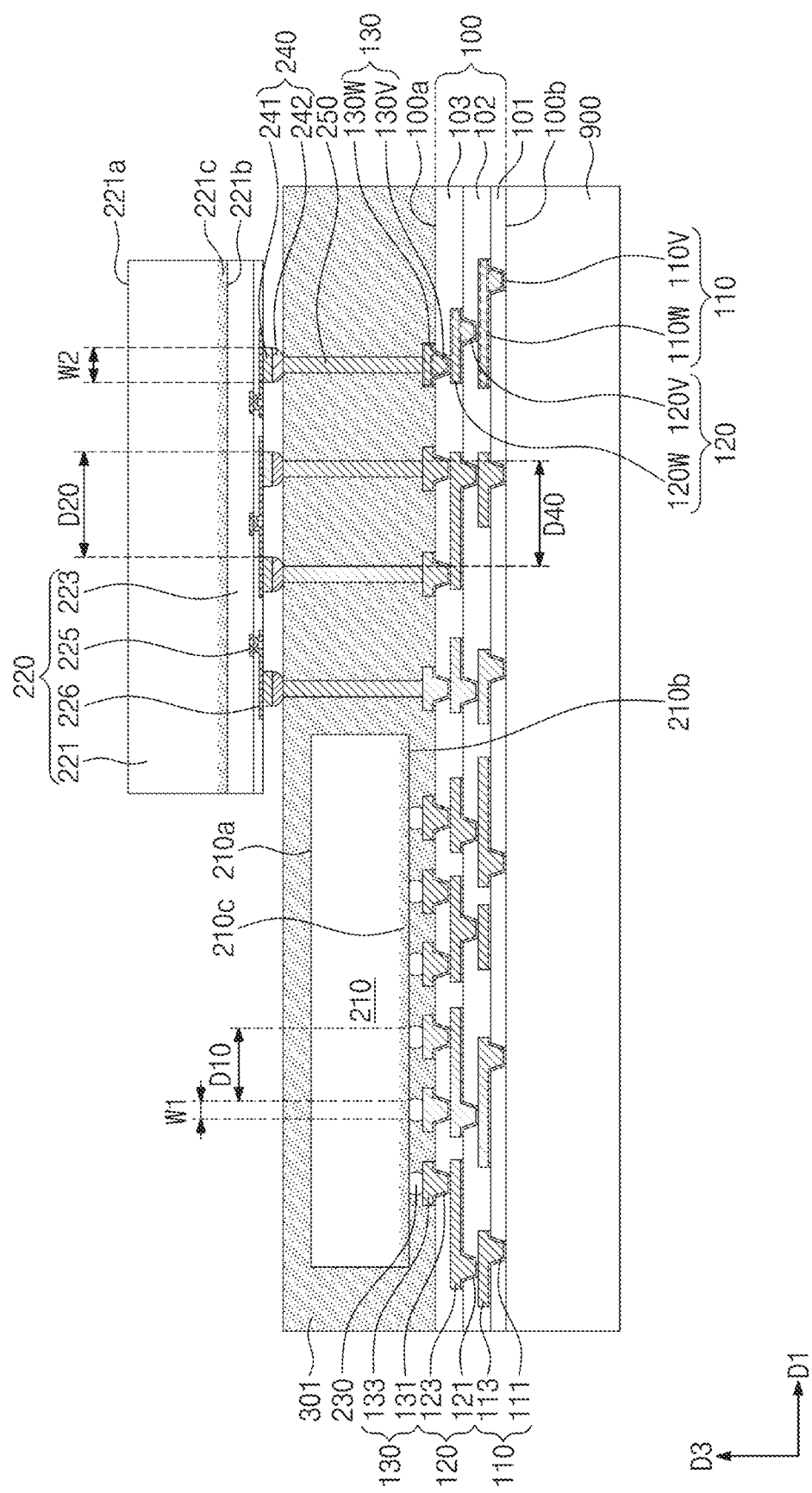

Referring to FIG. 5J, a second semiconductor chip 220 may be disposed on the first molding part 301. For example, the second semiconductor chip 220 fabricated by using the fabrication process of FIGS. 5A to 5E may be flipped and located on the first molding part 301.

The second semiconductor chip 220 may be placed to allow external connection members 240 to correspond to the conductive pillars 250. A solder pattern 242 of the external connection member 240 may be in direct contact with the conductive pillar 250. For example, a thermocompression process may be used to connect the external connection member 240 to the conductive pillar 250.

A second pitch D20 may be given as a pitch between the external connection members 240. A fourth pitch D40 may be given as a pitch between the conductive pillars 250. The fourth pitch D40 may be substantially equal to the second pitch D20. A second width W2 may be given as a maximum width of the external connection member 240. The second width W2 may be greater than the first width W1.

Figure 5K:
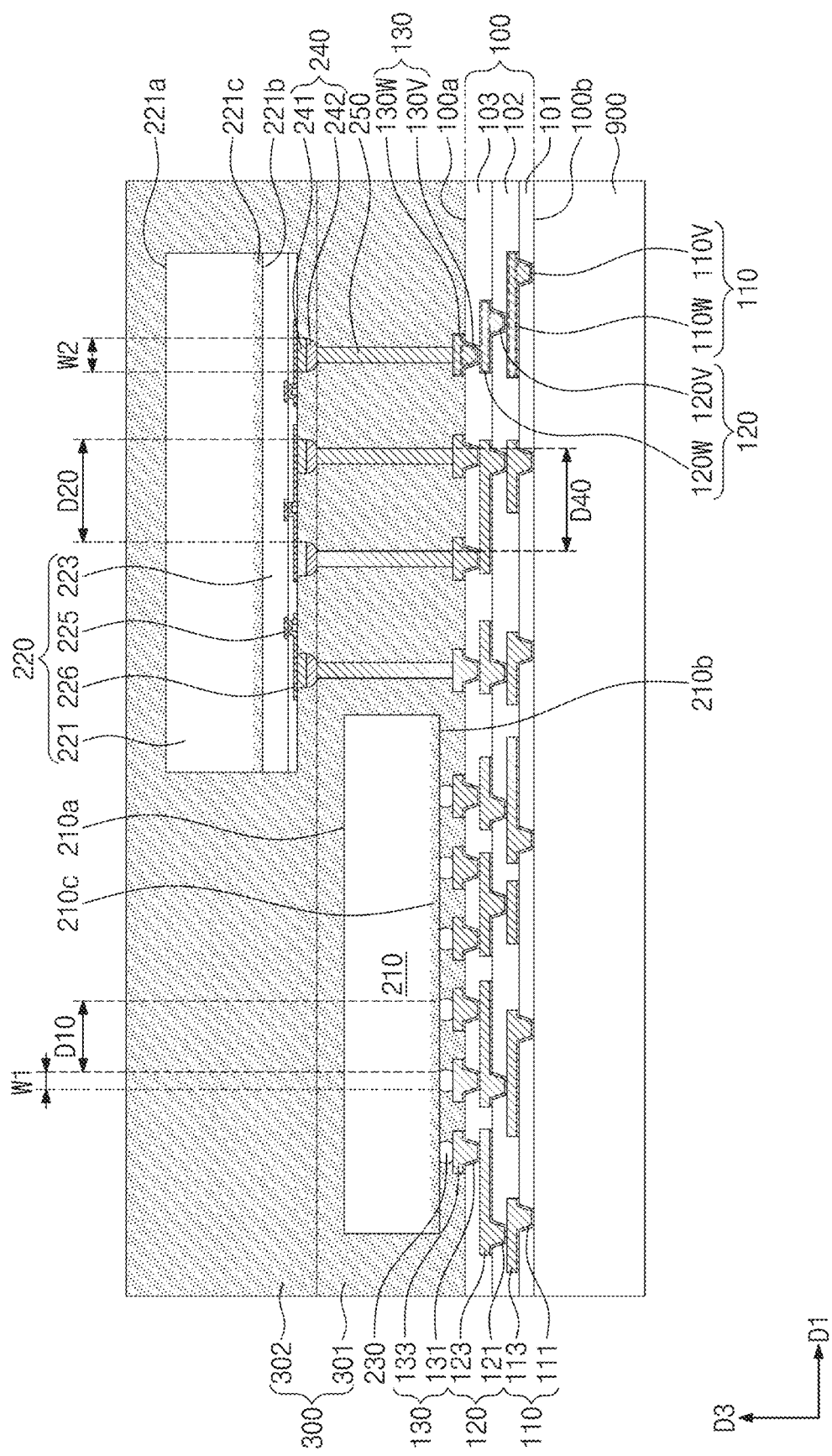

Referring to FIG. 5K, a second molding part 302 may be formed on the first molding part 301, covering the second semiconductor chip 220. The second molding part 302 may include, for example, a same material as that of the first molding part 301. For example, the first molding part 301 may include a dielectric polymer, such as an epoxy-based polymer. For another example, the second molding part 302 may include a different material from that of the first molding part 301.

The first molding part 301 and the second molding part 302 may constitute a molding layer 300. Differently from that shown, when the first molding part 301 and the second molding part 302 include a same material, an invisible interface may be provided between the first molding part 301 and the second molding part 302. A grinding process may be performed on a top surface of the molding layer 300. The top surface of the molding layer 300 may become planarized.

Referring to FIG. 5L, a second carrier substrate 901 may be disposed on the top surface of the molding layer 300. Afterwards, a semiconductor package may be flipped and the first carrier substrate 900 may be removed. The removal of the first carrier substrate 900 may expose the first redistribution pattern 110.

Bump patterns 350 may be formed on the exposed first redistribution pattern 110. External terminals 400 may be corresponding formed on the bump patterns 350. As a result, there may be fabricated a semiconductor package discussed with reference to FIG. 1.

Although a single semiconductor package is illustrated and explained in the interest of brevity of description, a semiconductor package fabrication according to the present inventive concepts is not limited to a wafer-level fabrication. For example, a semiconductor package may be fabricated in a panel level.

Figure 6:
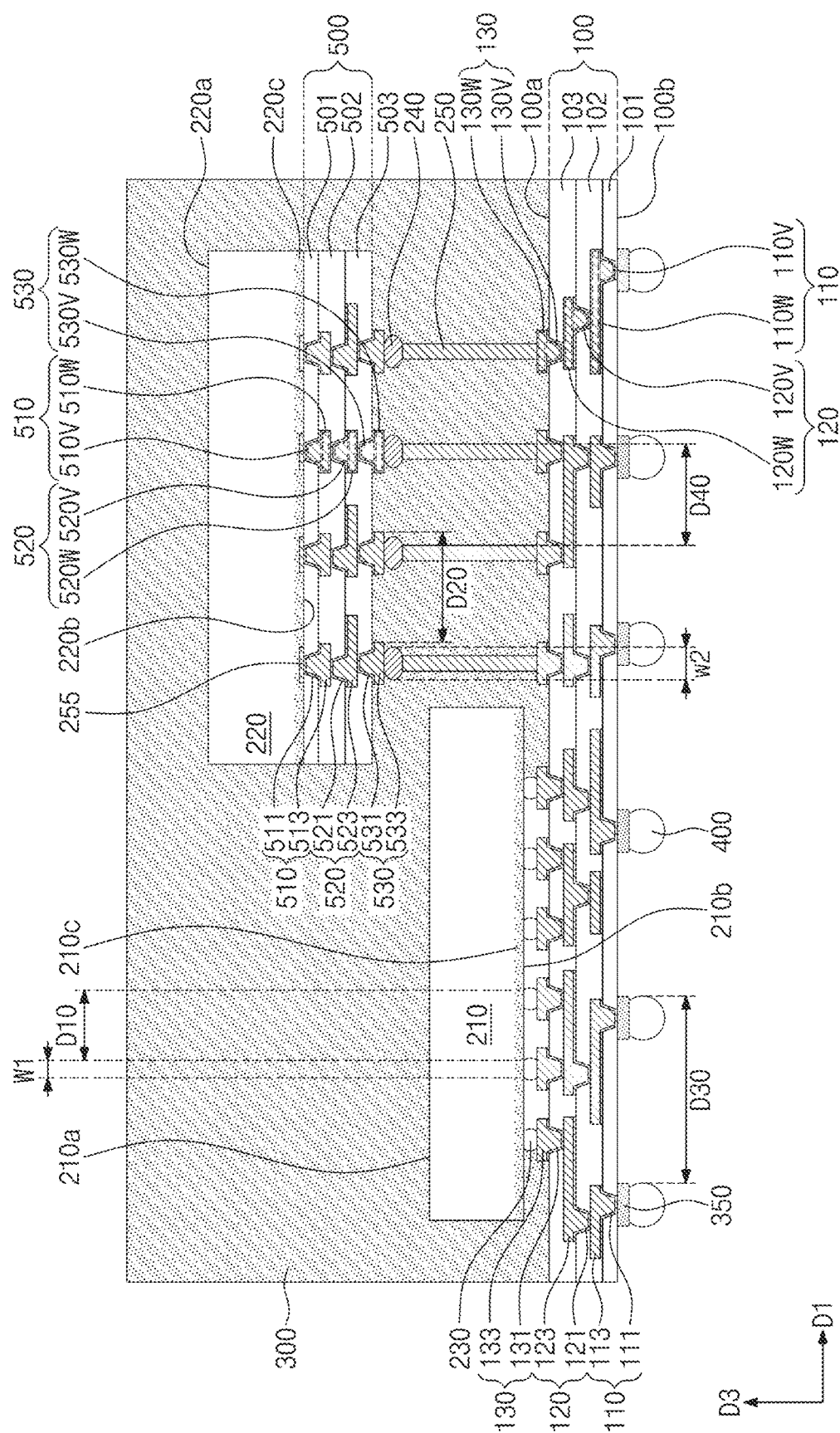
FIG. 6 illustrates a cross-sectional view showing a semiconductor package according to some embodiments of the present inventive concepts.

FIG. 6 illustrates a cross-sectional view showing a semiconductor package according to some embodiments of the present inventive concepts. In the embodiment that follows, omission will be made to avoid repetitive description of substantially the same components discussed with reference to FIGS. 1 to 3, and differences thereof will be explained in detail.

Referring to FIG. 6, a second semiconductor chip 220 may be provided above the first semiconductor chip 210 of the first redistribution substrate 100. The second semiconductor chip 220 may have an inactive surface 220a and an active surface 220b that are opposite to each other. The second semiconductor chip 220 may include an active section 220c adjacent to the active surface 220b thereof. The second semiconductor chip 220 may include chip pads 255 adjacent to the active surface 220b thereof. The chip pad 255 may have a bottom surface exposed by the second semiconductor chip 220. The chip pad 255 may include a conductive metallic material.

A second redistribution substrate 500 may be provided below the second semiconductor chip 220. The second redistribution substrate 500 may include a sixth redistribution dielectric layer 501, a seventh redistribution dielectric layer 502, an eighth redistribution dielectric layer 503, a fifth redistribution pattern 510, a sixth redistribution pattern 520, and a seventh redistribution pattern 530.

The second redistribution substrate 500 may include the sixth redistribution dielectric layer 501, the seventh redistribution dielectric layer 502, and the eighth redistribution dielectric layer 503 that are sequentially stacked in a direction from the first surface 100a toward the second surface 100b of the first redistribution substrate 100.

The fifth redistribution pattern 510 may be disposed below the sixth redistribution dielectric layer 501. The fifth redistribution pattern 510 may be provided on the chip pad 255. The sixth redistribution dielectric layer 501 may include, for example, a photo-imageable dielectric (PID) resin or an organic material such as photo-imageable polymer. In this description, the photo-imageable polymer may include, for example, at least one selected from photosensitive polyimide, polybenzoxazole, phenolic polymers, and benzocyclobutene polymers.

The sixth redistribution dielectric layer 501 may be disposed below the seventh redistribution dielectric layer 502. The seventh redistribution dielectric layer 502 may include a same material as that of the sixth redistribution dielectric layer 501.

The fifth redistribution pattern 510 may include a fourth via part 510V and a fourth wire part 510W. The fifth redistribution pattern 510 may include a fourth seed pattern 511 and a fourth conductive layer 513.

The sixth redistribution pattern 520 may be disposed below the fifth redistribution pattern 510. The sixth redistribution pattern 520 may be electrically coupled to the fifth redistribution pattern 510. The sixth redistribution pattern 520 may include a fifth via part 520V and a fifth wire part 520W. The sixth redistribution pattern 520 may include a fifth seed pattern 521 and a fifth conductive layer 523.

The eighth redistribution dielectric layer 503 may be disposed below the seventh redistribution dielectric layer 502. The eighth redistribution dielectric layer 503 may include a same material as that of the sixth redistribution dielectric layer 501.

The seventh redistribution pattern 530 may be disposed below the sixth redistribution pattern 520. The seventh redistribution pattern 530 may include a sixth via part 530V and a sixth wire part 530W. The seventh redistribution pattern 530 may include a sixth seed pattern 531 and a sixth conductive layer 533.

Each of the fourth, fifth, and sixth via parts 510V, 520V, and 530V may have a width that increases in a direction from the first surface 100a toward the second surface 100b of the first redistribution substrate 100. The second redistribution substrate 500 may be substantially the same as the first redistribution substrate 100 discussed with reference to FIG. 1, but the first and second redistribution substrates 100 and 500 may be oppositely oriented in a top-down position.

An external connection member 240 may be interposed between the seventh redistribution pattern 530 and the conductive pillar 250. Differently from the description with reference to FIG. 3, the external connection member 240 may not include the conductive bump pattern 241. The external connection member 240 may be in direct contact with the conductive pillar 250.

According to the present inventive concepts, a redistribution layer of a second semiconductor chip may be formed not through a Post-FAB process, but through an In-FAB process. For example, the redistribution layer of the second semiconductor chip may be formed by using a semiconductor chip fabrication process as it is. Therefore, there may be an advantage that the redistribution layer of the second semiconductor chip is formed in an In-FAB process without requiring additional equipment investment.

According to the present inventive concepts, conductive pillars may be used such that the second semiconductor chip is disposed to allow its portion to vertically overlap a first semiconductor chip. Therefore, a semiconductor package may have a size that is smaller in a case where the second semiconductor chip is disposed to allow its portion to vertically overlap the first semiconductor chip than in a case where the second semiconductor chip is located at a same level as that of the first semiconductor chip. As a result, a compact-sized semiconductor package may be provided.

In addition, an In-FAB process may be used to form a redistribution layer of the second semiconductor chip, and thus it may be possible that external connection members are formed to allow their pitch to correspond to that of conductive pillars without forming an additional redistribution substrate. As a result, the conductive pillars may be used to facilitate a reduction in size of a semiconductor package.

According to some embodiments of the present inventive concepts, because the redistribution layer of the second semiconductor chip is formed in an In-FAB process, a semiconductor chip may be prevented or reduced from performance deterioration caused by high-temperature heat. Accordingly, a semiconductor package may improve in electrical properties. In addition, it may be possible to omit the formation of redistribution patterns by using a plating process in a Post-FAB process and as a result to achieve simplification of fabrication process.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Although the present inventive concepts have been described in connection with the embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A method of fabricating a semiconductor package, comprising:
   forming a device layer on a semiconductor substrate;
   forming a wiring layer on the device layer, the wiring layer including a conductive pad; and
   forming a redistribution layer on the wiring layer,
   wherein the forming the redistribution layer comprises:
      forming a first redistribution dielectric layer on the wiring layer, the first redistribution dielectric layer exposing the conductive pad; and
      performing a deposition process of a redistribution pattern on the first redistribution dielectric layer, the redistribution pattern including a contact part directly on the conductive pad and a pad part,
   the method further comprising:
   forming a dielectric film on the redistribution layer, the dielectric film covering the contact part and exposing the pad part;
   forming a conductive bump pattern directly on the pad part; and
   forming a solder pattern directly on the conductive bump pattern.

2. The method of claim 1, wherein the redistribution pattern includes aluminum.

3. The method of claim 1, wherein the performing the deposition process of the redistribution pattern includes:
   performing a deposition process of a preliminary redistribution pattern on the first redistribution dielectric layer; and
   patterning the preliminary redistribution pattern.

4. The method of claim 1, wherein:
   the first redistribution dielectric layer includes a silicon oxide layer or a silicon oxynitride layer; and
   the dielectric film includes an organic polymer layer.

5. The method of claim 1, wherein the forming the redistribution layer further includes forming a second redistribution dielectric layer on the redistribution pattern and the first redistribution dielectric layer, the second redistribution dielectric layer exposing the contact part and the pad part.

6. The method of claim 5, wherein the forming the second redistribution dielectric layer includes:
   forming a lower dielectric layer including an inorganic dielectric material; and
   forming an upper dielectric layer including an organic polymer layer on the lower dielectric layer.

7. The method of claim 5, wherein the redistribution pattern further includes a line part that extends from the contact part toward the pad part.

8. The method of claim 7, wherein the second redistribution dielectric layer and the dielectric film covers the line part.

9. The method of claim 1, wherein the forming the conductive bump pattern comprises:
   forming a seed pattern directly on the pad part; and
   forming a conductive pattern directly on the seed pattern.

10. A method of fabricating a semiconductor package, comprising:
    forming a redistribution substrate having a first surface;
    disposing a first semiconductor chip on the first surface;
    forming conductive pillars on the first surface;
    fabricating a second semiconductor chip;
    forming an external connection member on the second semiconductor chip; and
    connecting the external connection member to the conductive pillars, thereby disposing the second semiconductor chip on the first surface;
    wherein the fabricating the second semiconductor chip comprises:
       forming a device layer on a semiconductor substrate;
       forming a wiring layer on the device layer, the wiring layer including a conductive pad; and
       forming a redistribution layer on the wiring layer,
    wherein the forming the redistribution layer comprises:
       forming a first redistribution dielectric layer on the wiring layer, the first redistribution dielectric layer exposing the conductive pad; and
       performing a deposition process of a redistribution pattern on the first redistribution dielectric layer, the redistribution pattern including a contact part directly on the conductive pad and a pad part,
    wherein the forming the external connection member comprises:
       forming a dielectric film on the redistribution layer, the dielectric film covering the contact part and exposing the pad part;
       forming a conductive bump pattern directly on the pad part; and
       forming a solder pattern directly on the conductive bump pattern.

11. The method of claim 10, wherein the solder pattern is in direct contact with the conductive pillars.

12. The method of claim 10, wherein the second semiconductor chip is located at a higher level than the first semiconductor chip.

13. The method of claim 10, wherein the redistribution substrate has a second surface opposite to the first surface, and
    the method further comprises forming external terminals on the second surface.

14. The method of claim 13, wherein the forming the redistribution substrate comprises:
    patterning a third redistribution dielectric layer, thereby forming a first hole in the third redistribution dielectric layer; and
    forming first redistribution patterns on the third redistribution dielectric layer.

15. The method of claim 14, wherein the third redistribution dielectric layer includes a photo-imageable dielectric (PID) resin or a photo-imageable polymer.

16. The method of claim 14, wherein the forming the first redistribution patterns comprises:
    forming a first seed layer on the third redistribution dielectric layer; and
    forming a first conductive layer on the first seed layer.

17. The method of claim 16, wherein the forming the first redistribution patterns further comprises:
    forming a first resist pattern on the first seed layer; and
    patterning the first resist pattern thereby forming an opening, the opening vertically overlapping the first hole, and
    wherein the first conductive layer fills at least a part of the opening.

18. The method of claim 14, wherein the forming the redistribution substrate further comprises:
    forming a fourth redistribution dielectric layer on the third redistribution dielectric layer; and
    forming second redistribution patterns on the fourth redistribution dielectric layer.

19. The method of claim 18, wherein the fourth redistribution dielectric layer includes a photo-imageable dielectric (PID) resin or a photo-imageable polymer.

20. The method of claim 18, wherein the forming the second redistribution patterns comprises:
    forming a second seed layer on the fourth redistribution dielectric layer; and
    forming a second conductive layer on the second seed layer.

* * * * *